US012713747B2

(12) United States Patent
Hong et al.

(10) Patent No.: US 12,713,747 B2
(45) Date of Patent: Aug. 18, 2026

(54) DISPLAY DEVICE COMPRISING SEMICONDUCTOR LIGHT EMITTING DEVICE IN OPENING HOLE OF PLANARIZATION LAYER

(71) Applicants: LG DISPLAY CO., LTD., Seoul (KR); LG ELECTRONICS INC., Seoul (KR)

(72) Inventors: Gisang Hong, Paju-si (KR); Jaeyoung Oh, Paju-si (KR); Jungmin Kim, Paju-si (KR); Wonseok Choi, Seoul (KR)

(73) Assignees: LG DISPLAY CO., LTD., Seoul (KR); LG ELECTRONICS INC., Seoul (KR)

( * ) Notice: Subject to any disclaimer, the term of this patent is extended or adjusted under 35 U.S.C. 154(b) by 399 days.

(21) Appl. No.: 18/286,491

(22) PCT Filed: Apr. 12, 2022

(86) PCT No.: PCT/KR2022/005309
§ 371 (c)(1),
(2) Date: Oct. 11, 2023

(87) PCT Pub. No.: WO2022/220558
PCT Pub. Date: Oct. 20, 2022

(65) Prior Publication Data

US 2024/0194844 A1 Jun. 13, 2024

(30) Foreign Application Priority Data

Apr. 12, 2021 (KR) ........................ 10-2021-0047309

(51) Int. Cl.
*H10H 20/857* (2025.01)
*H10D 86/40* (2025.01)
(Continued)

(52) U.S. Cl.
CPC ........ *H10H 20/857* (2025.01); *H10D 86/443* (2025.01); *H10D 86/60* (2025.01); *H10H 20/814* (2025.01); *H10W 90/00* (2026.01)

(58) Field of Classification Search
CPC .... H10H 20/857; H10H 20/814; H01D 86/60; H01L 25/0753; H01L 25/167
See application file for complete search history.

(56) References Cited

U.S. PATENT DOCUMENTS

2017/0263672 A1* 9/2017 Seo ..................... H01L 25/0753
2017/0269749 A1* 9/2017 Bok .................... G02F 1/13338
(Continued)

FOREIGN PATENT DOCUMENTS

KR 10-2018-0032715 A 4/2018
KR 10-2019-0068112 A 6/2019
(Continued)

OTHER PUBLICATIONS

International Search Report (PCT/ISA/210) issued in PCT/KR2022/005309 mailed on Aug. 9, 2022.

*Primary Examiner* — Michael Jung
(74) *Attorney, Agent, or Firm* — Birch, Stewart, Kolasch & Birch, LLP

(57) ABSTRACT

A display device including a semiconductor light emitting device according to an embodiment has a substrate, a first assembly wiring and a second assembly wiring spaced apart from each other on the substrate, a planarization layer having an opening hole and a contact hole on the first assembly wiring and the second assembly wiring, a light emitting device disposed within the opening of the planarization layer, a first electrode thereof overlapping the first assembly wiring and the second assembly wiring, and a first
(Continued)

light absorption layer disposed to surround an area where the light emitting device is disposed and having light absorption characteristics.

18 Claims, 20 Drawing Sheets

(51) Int. Cl.
*H10D 86/60* (2025.01)
*H10H 20/814* (2025.01)
*H10W 90/00* (2026.01)

(56) References Cited

U.S. PATENT DOCUMENTS

2017/0294424 A1* 10/2017 Jeong .................. H10H 20/855
2017/0336690 A1* 11/2017 Lee .................... H01L 25/0753
2018/0083218 A1 3/2018 Choi et al.
2019/0019816 A1 1/2019 Kang et al.
2019/0393387 A1 12/2019 Kwon et al.
2020/0135971 A1 4/2020 Beak et al.
2020/0350476 A1 11/2020 Lee et al.
2022/0077253 A1* 3/2022 Yang .................... H01L 25/167
2023/0059135 A1 2/2023 Chang et al.
2023/0110862 A1 4/2023 Kim et al.

FOREIGN PATENT DOCUMENTS

KR 10-2019-0075869 A 7/2019
KR 10-2019-0143840 A 12/2019
KR 10-2020-0026845 A 3/2020
KR 10-2020-0049394 A 5/2020
KR 10-2020-0127863 A 11/2020

* cited by examiner

[FIG. 1]
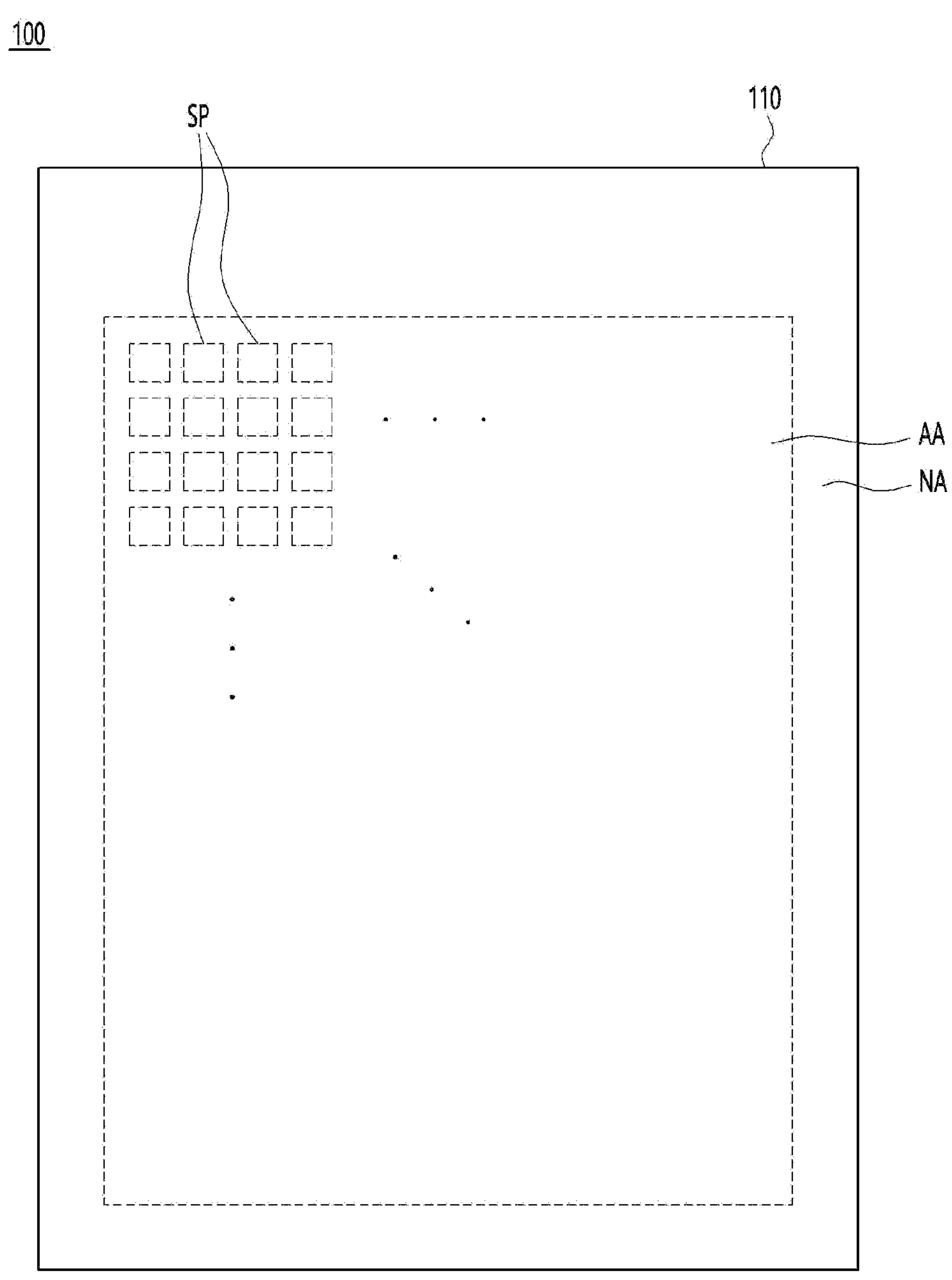

[FIG. 2]
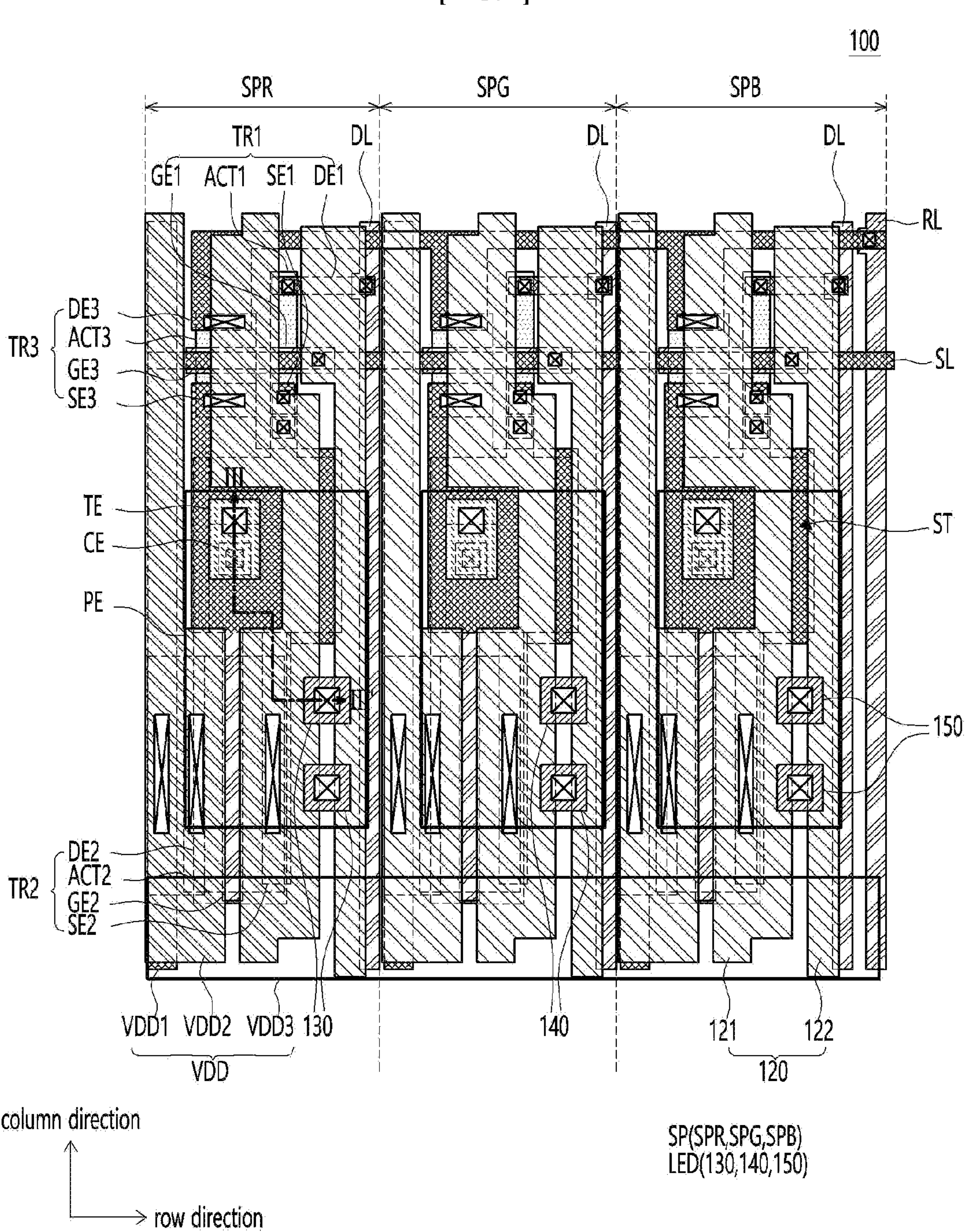

[FIG. 3]
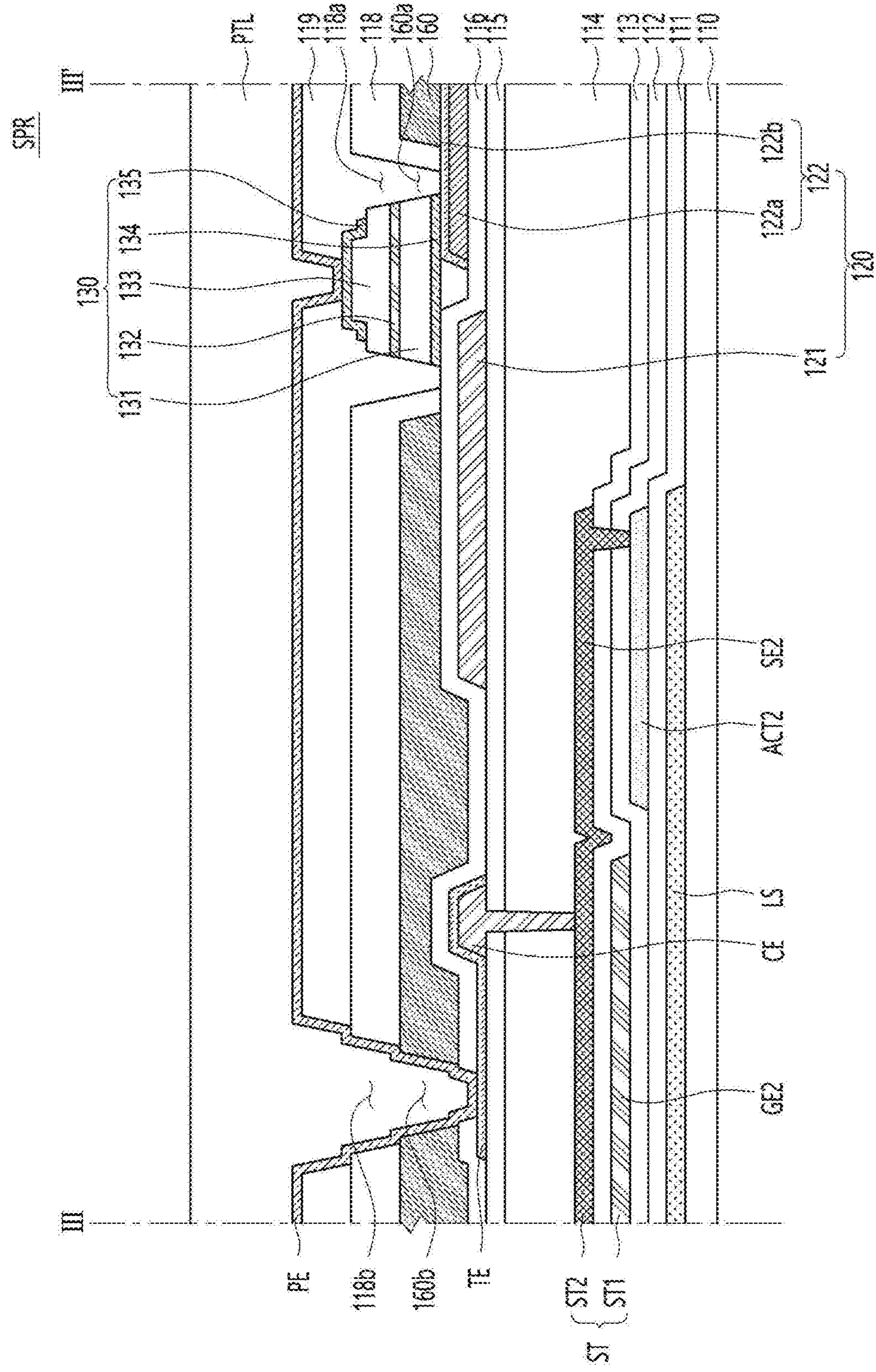

[FIG. 4A]
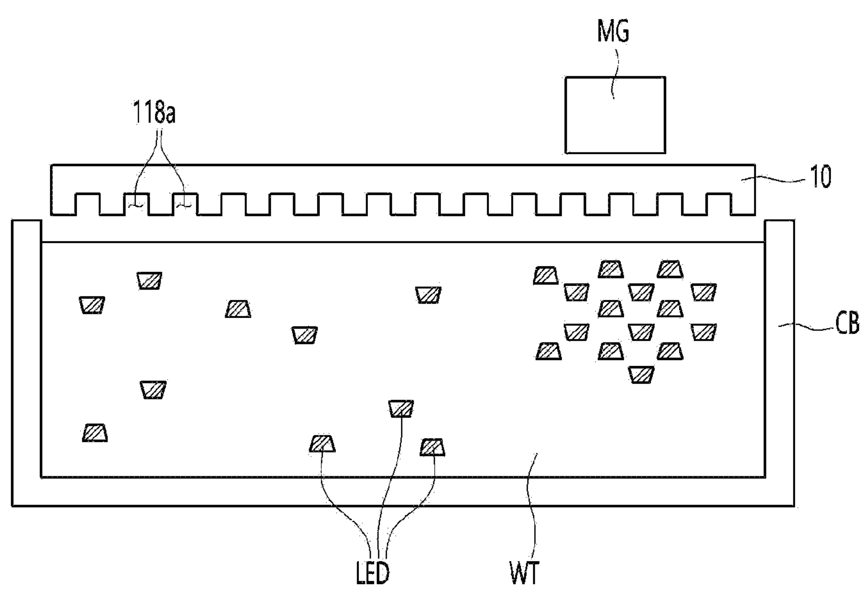

[FIG. 4B]
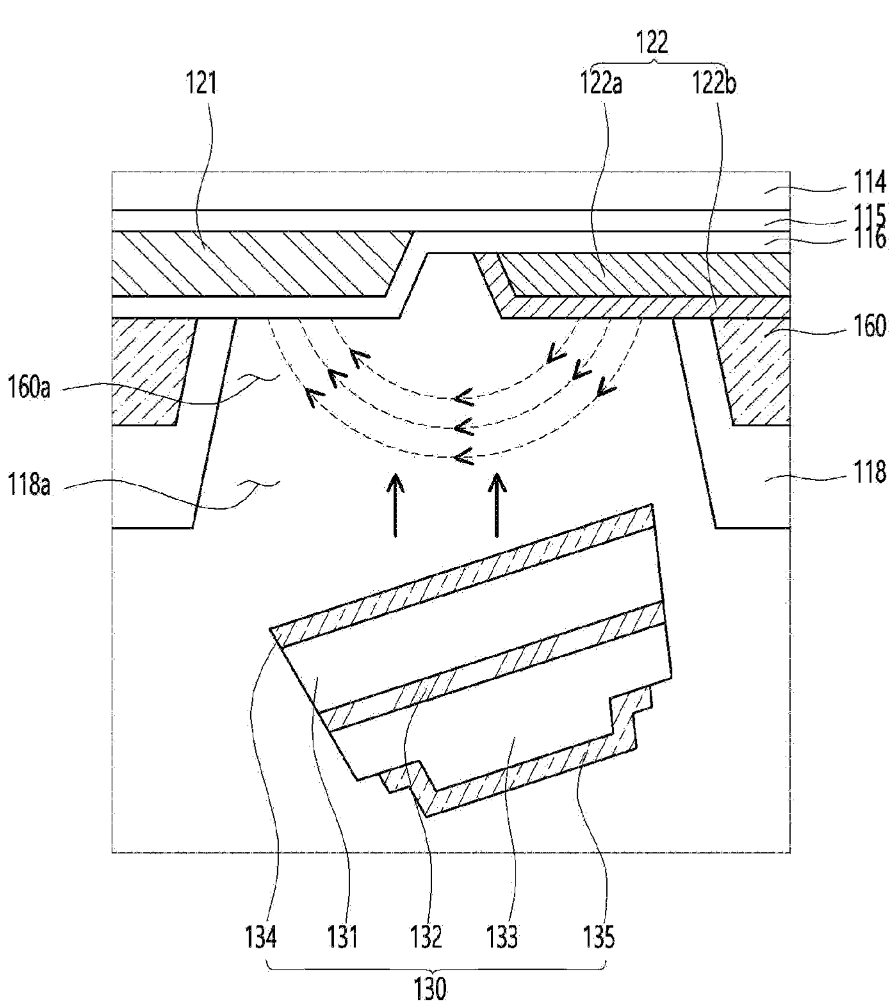

[FIG. 4C]
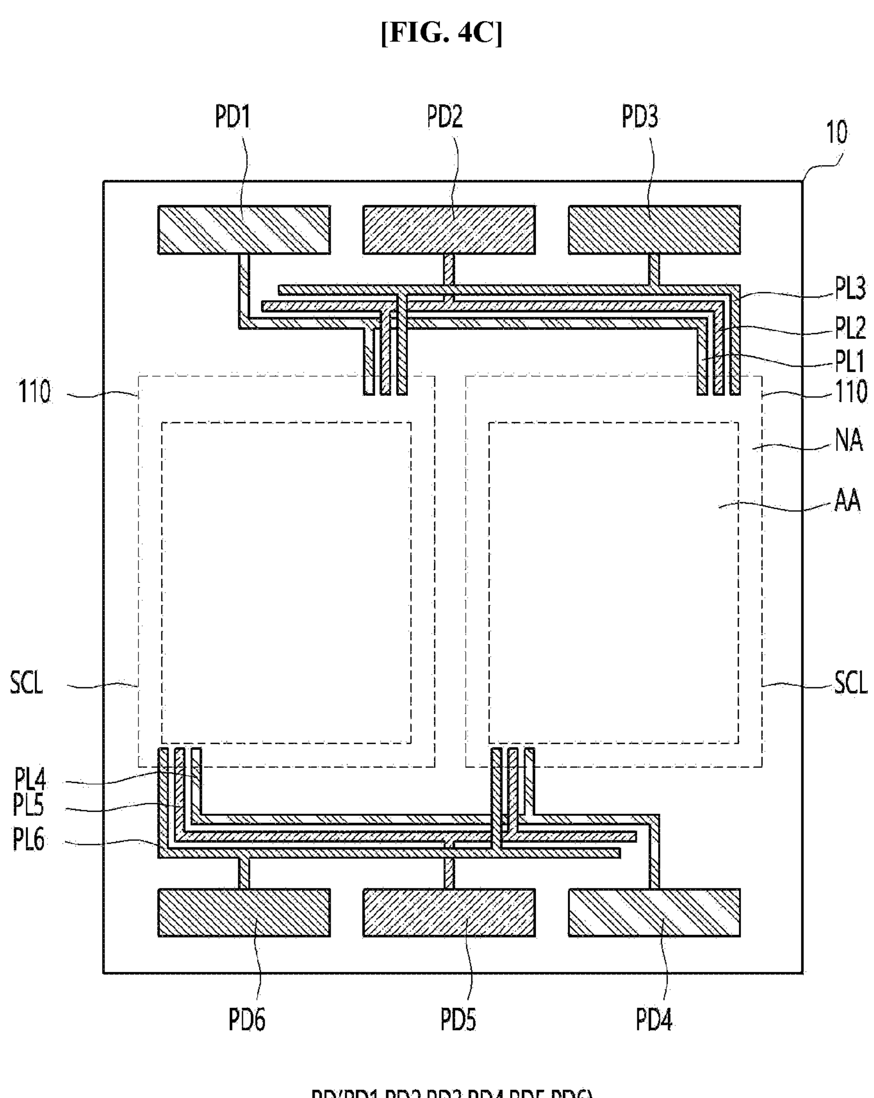

[FIG. 4D]
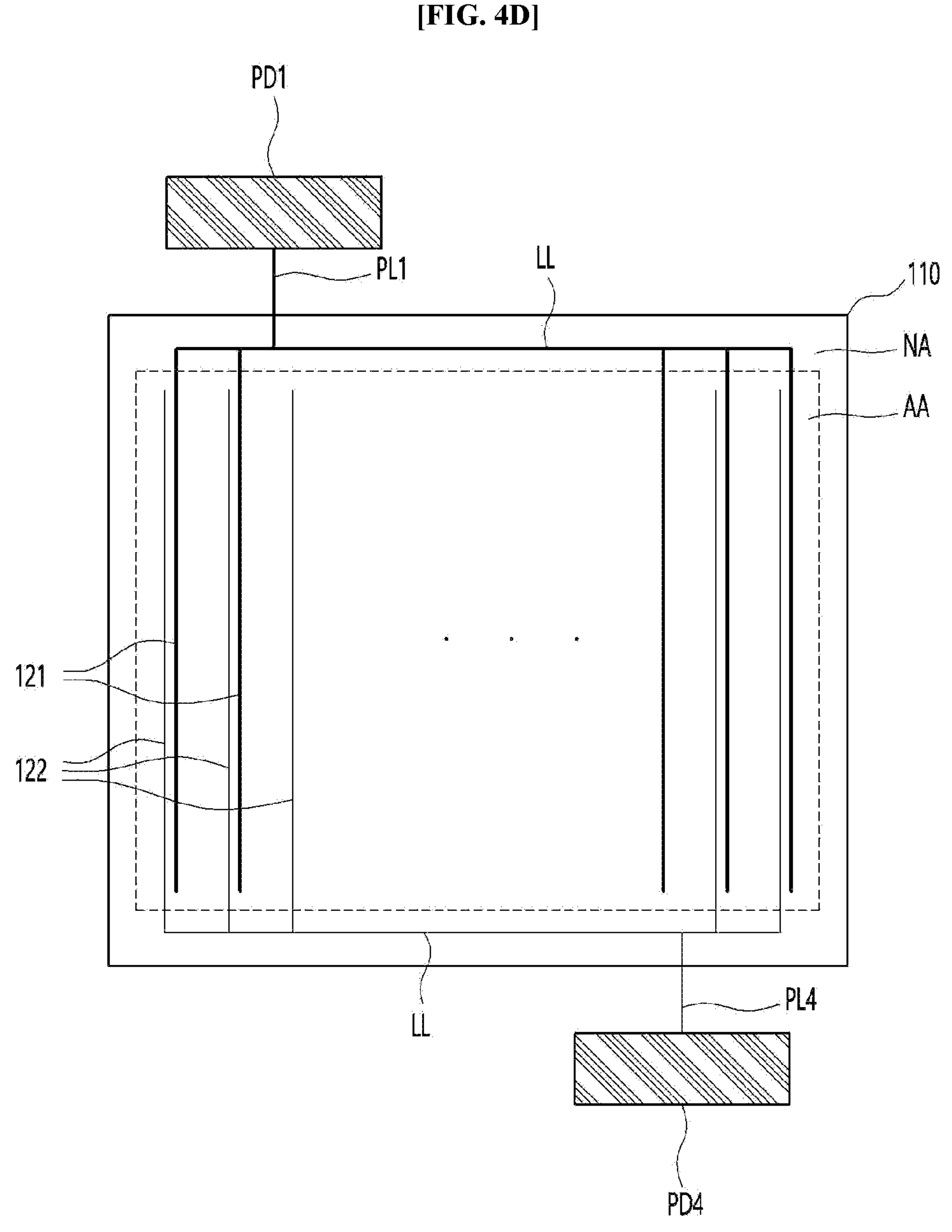

[FIG. 4E]
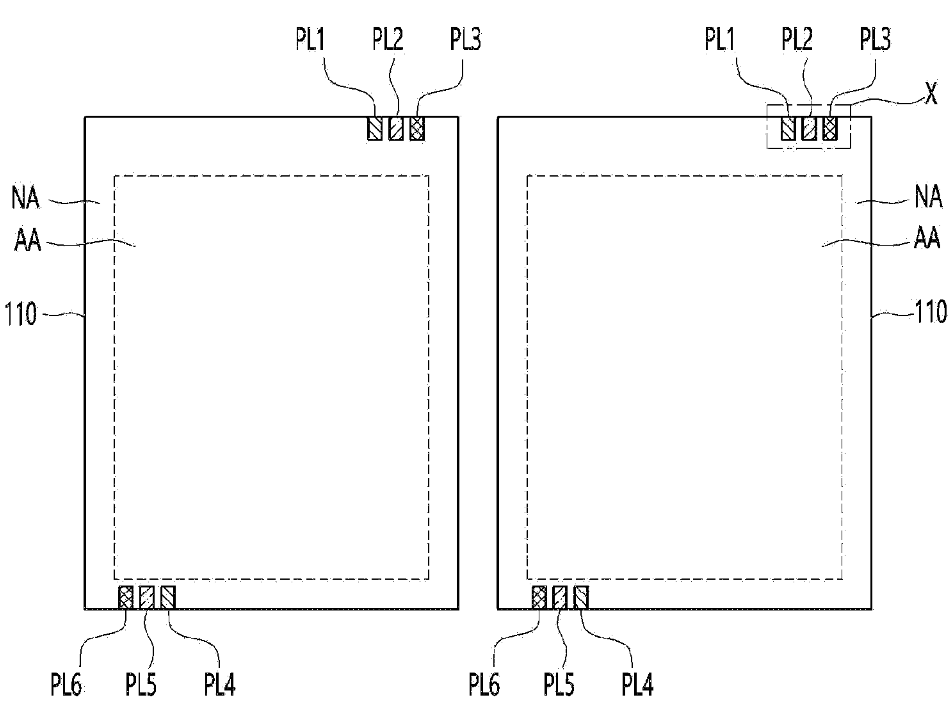

[FIG. 4F]
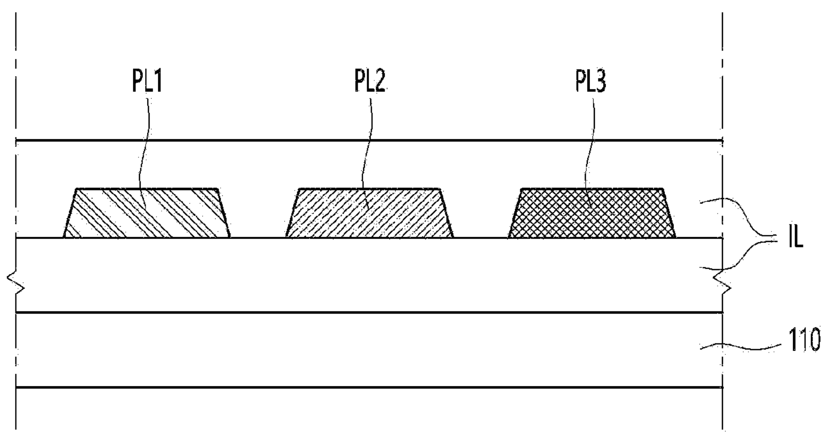

[FIG. 5]
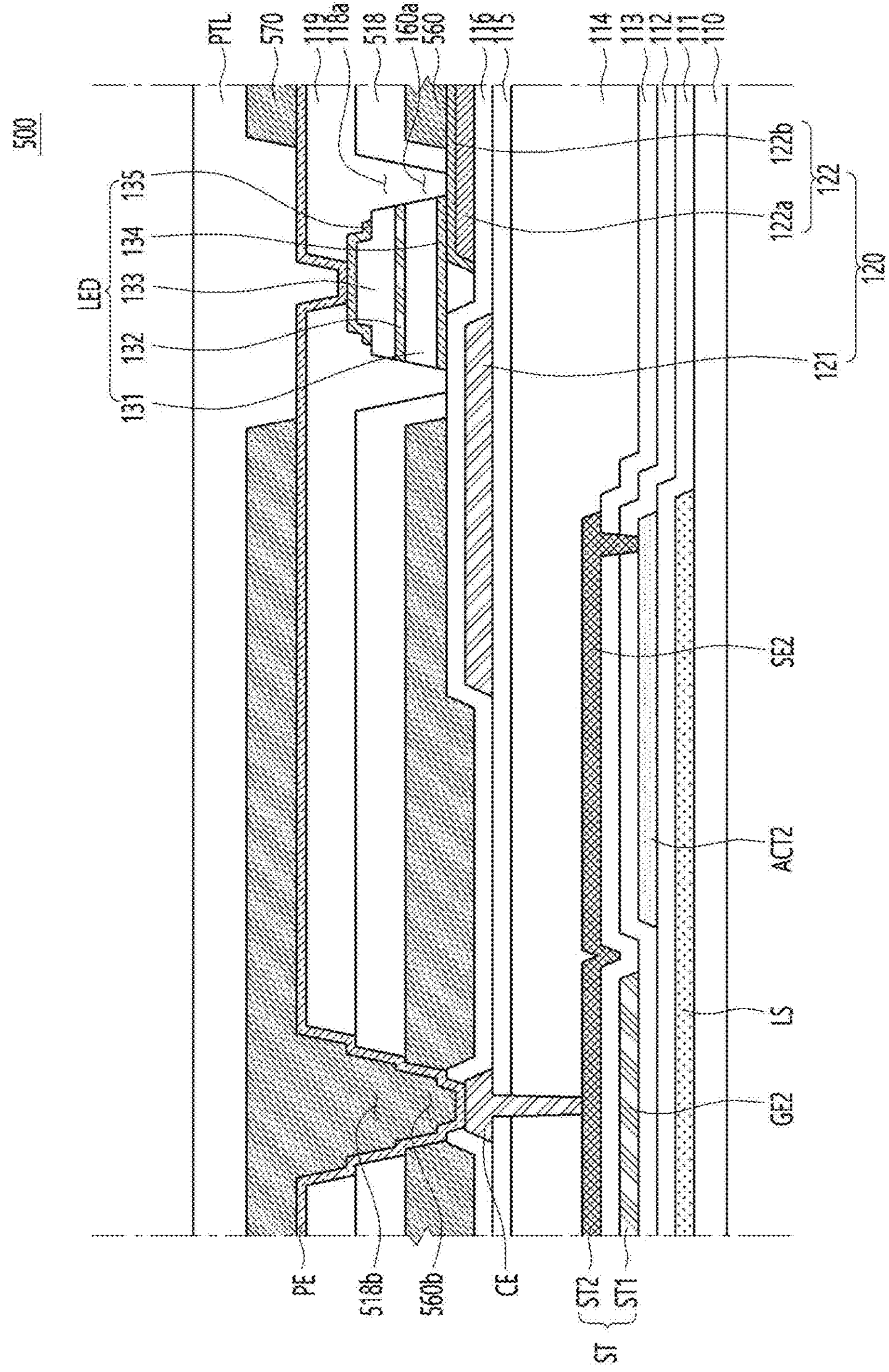

[FIG. 6]

[FIG. 7]
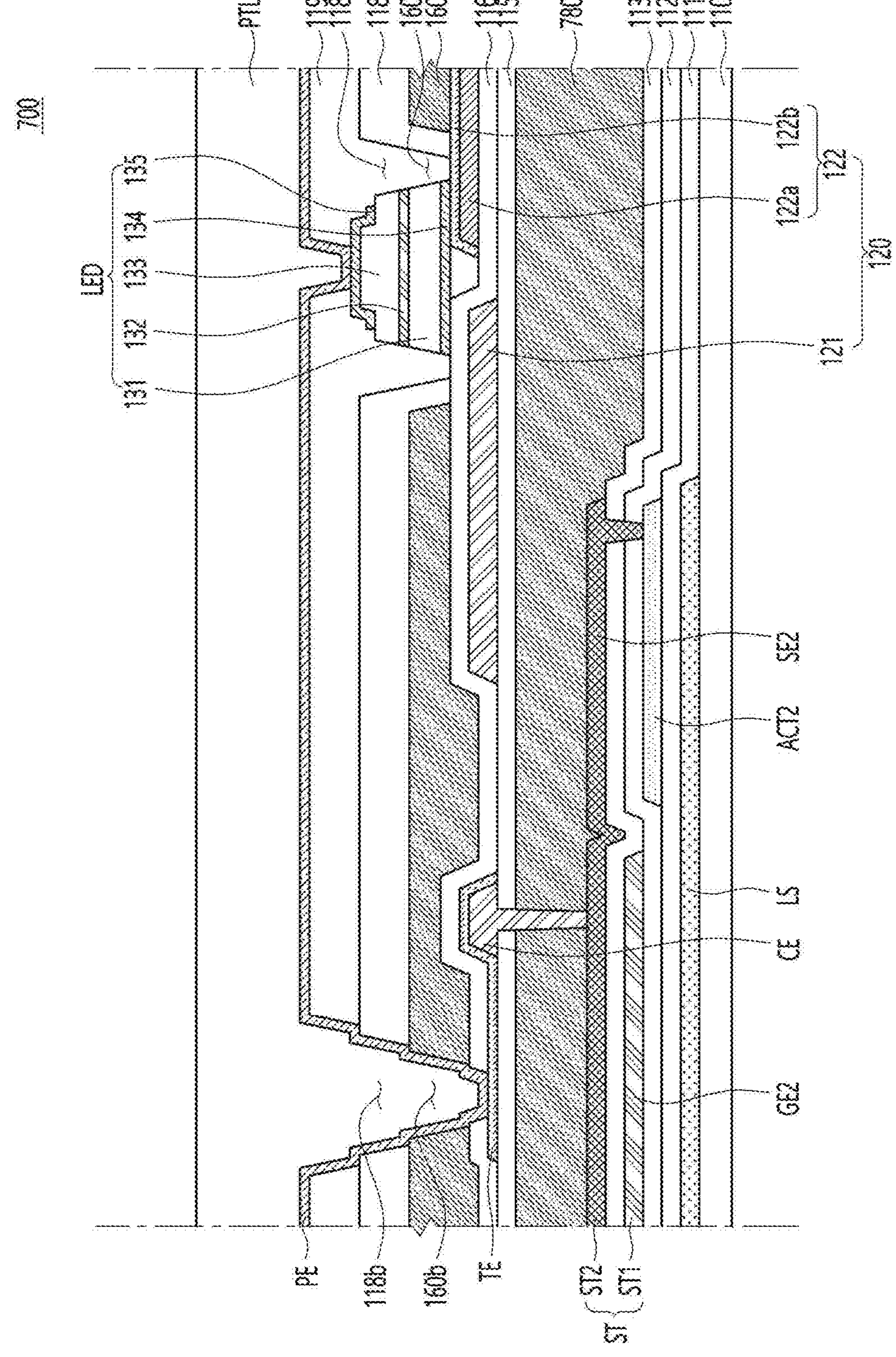

[FIG. 8]
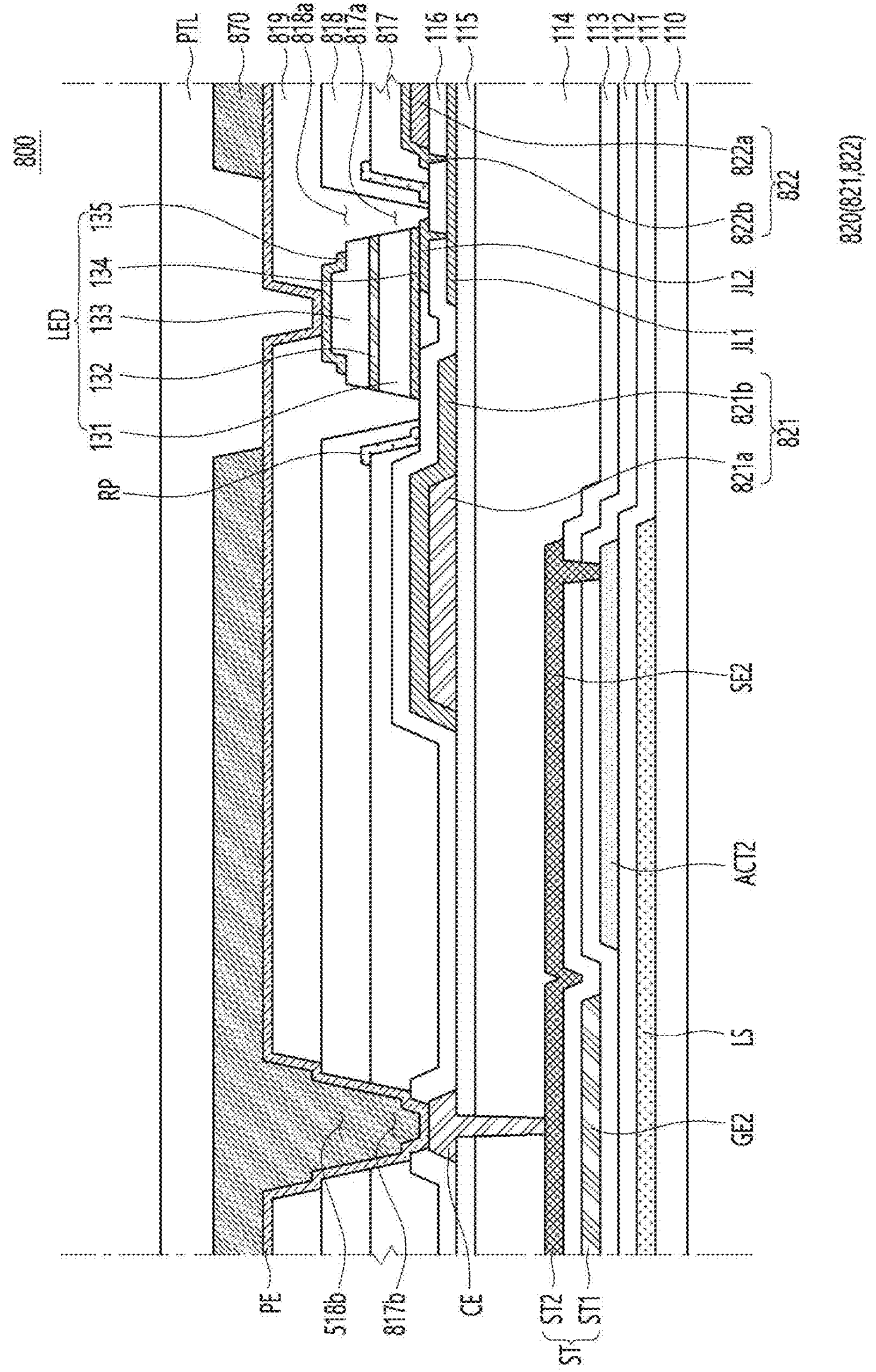

[FIG. 9]
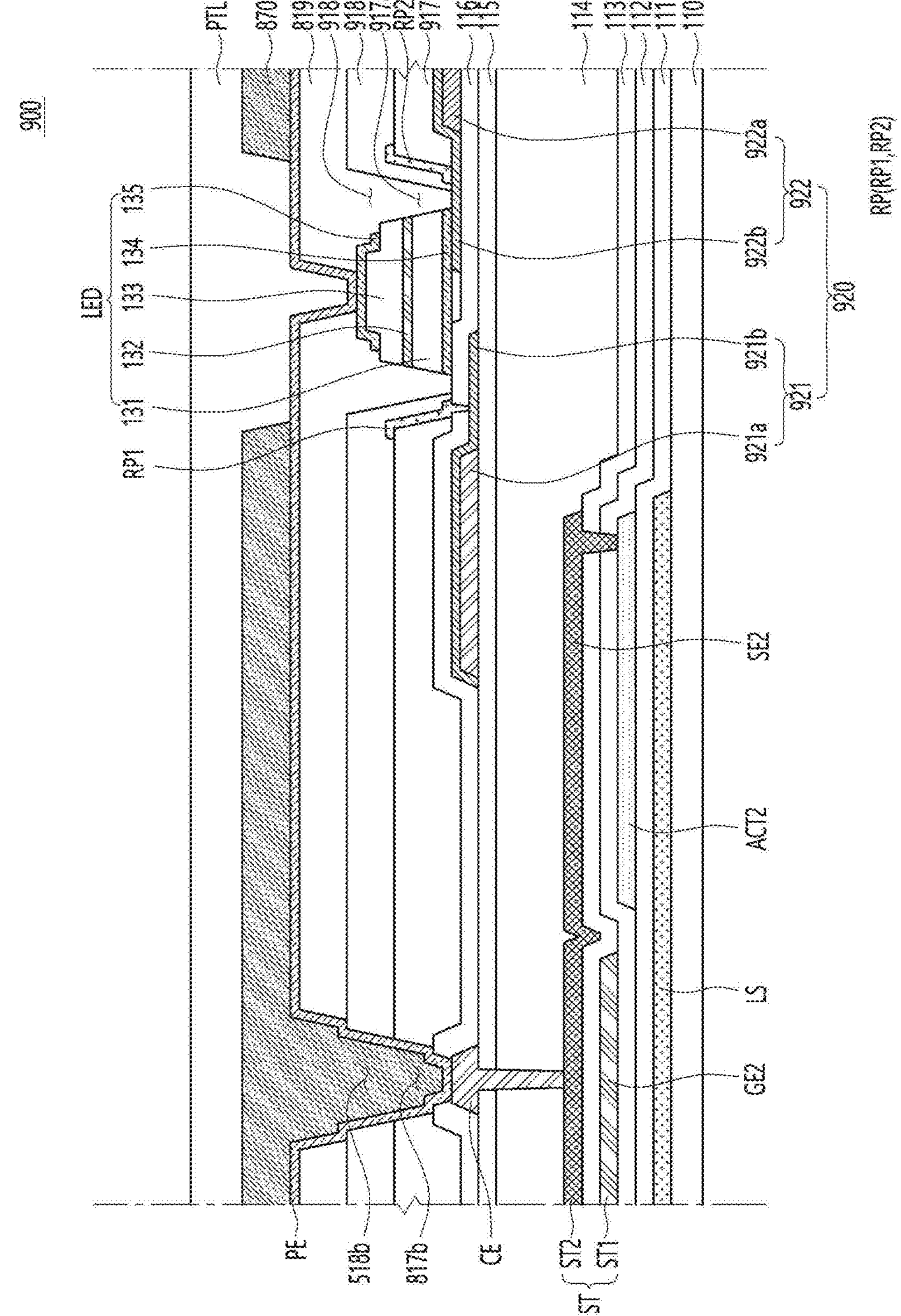

[FIG. 10]
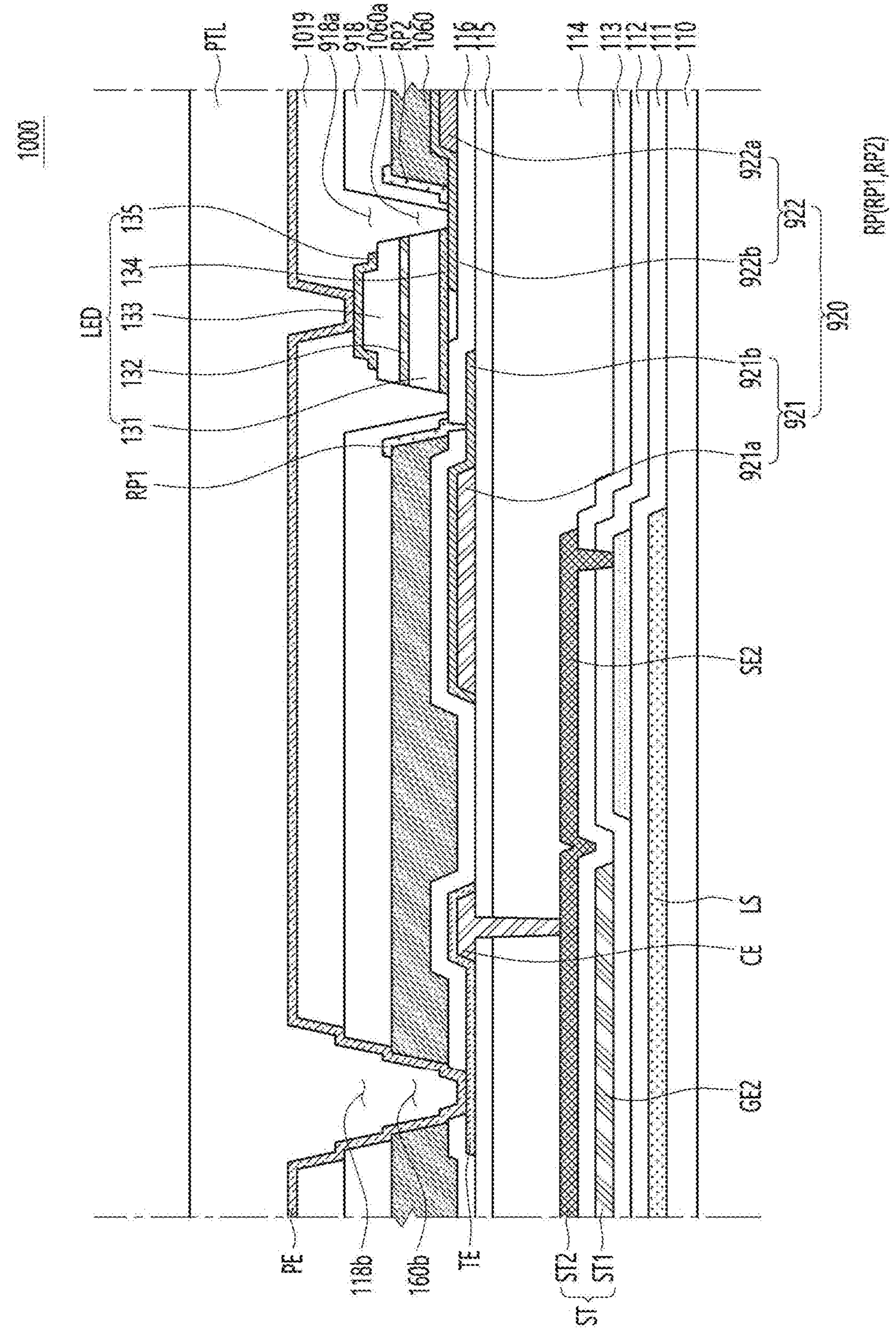

[FIG. 11]
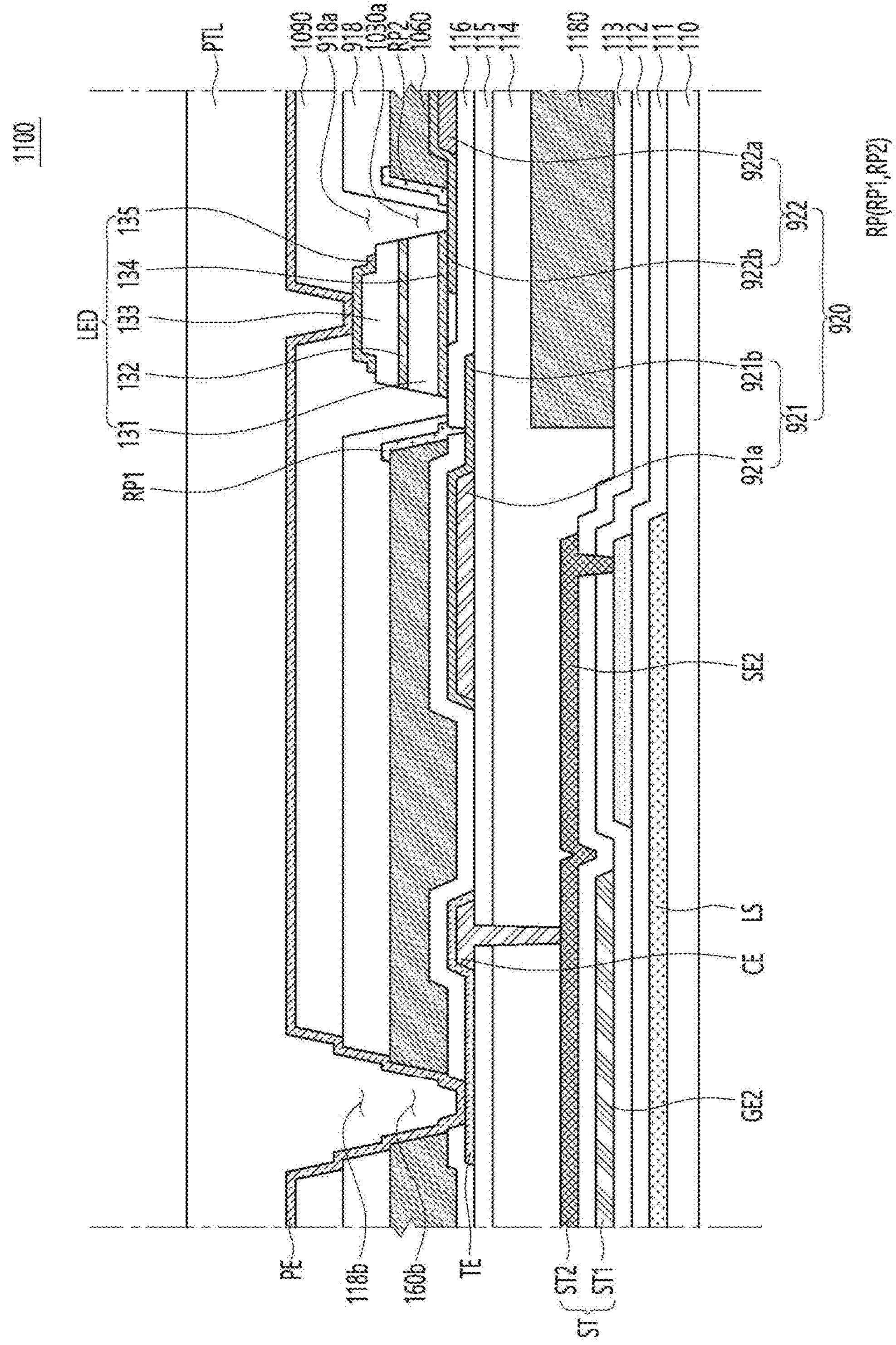

[FIG. 12]
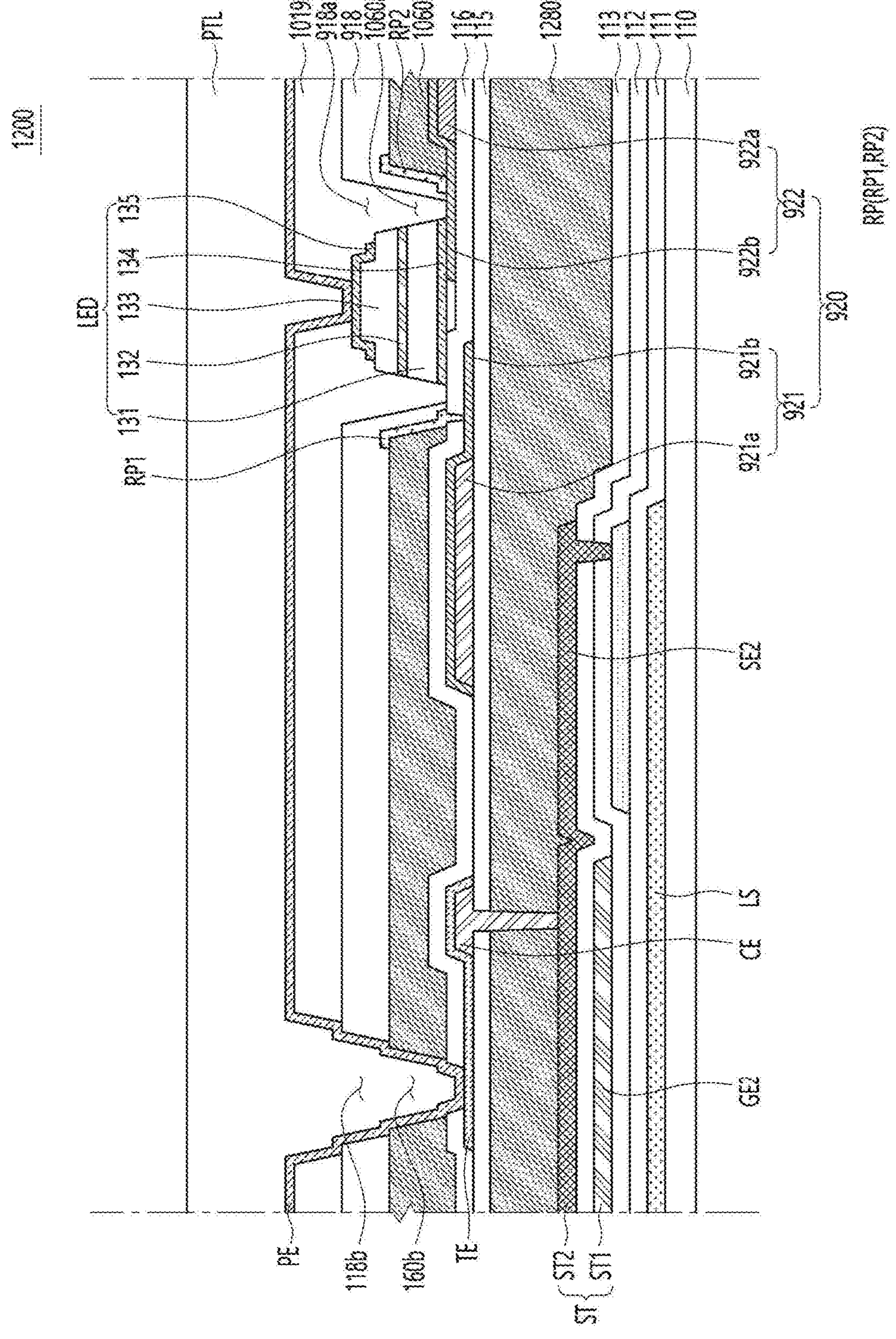

[FIG. 13]
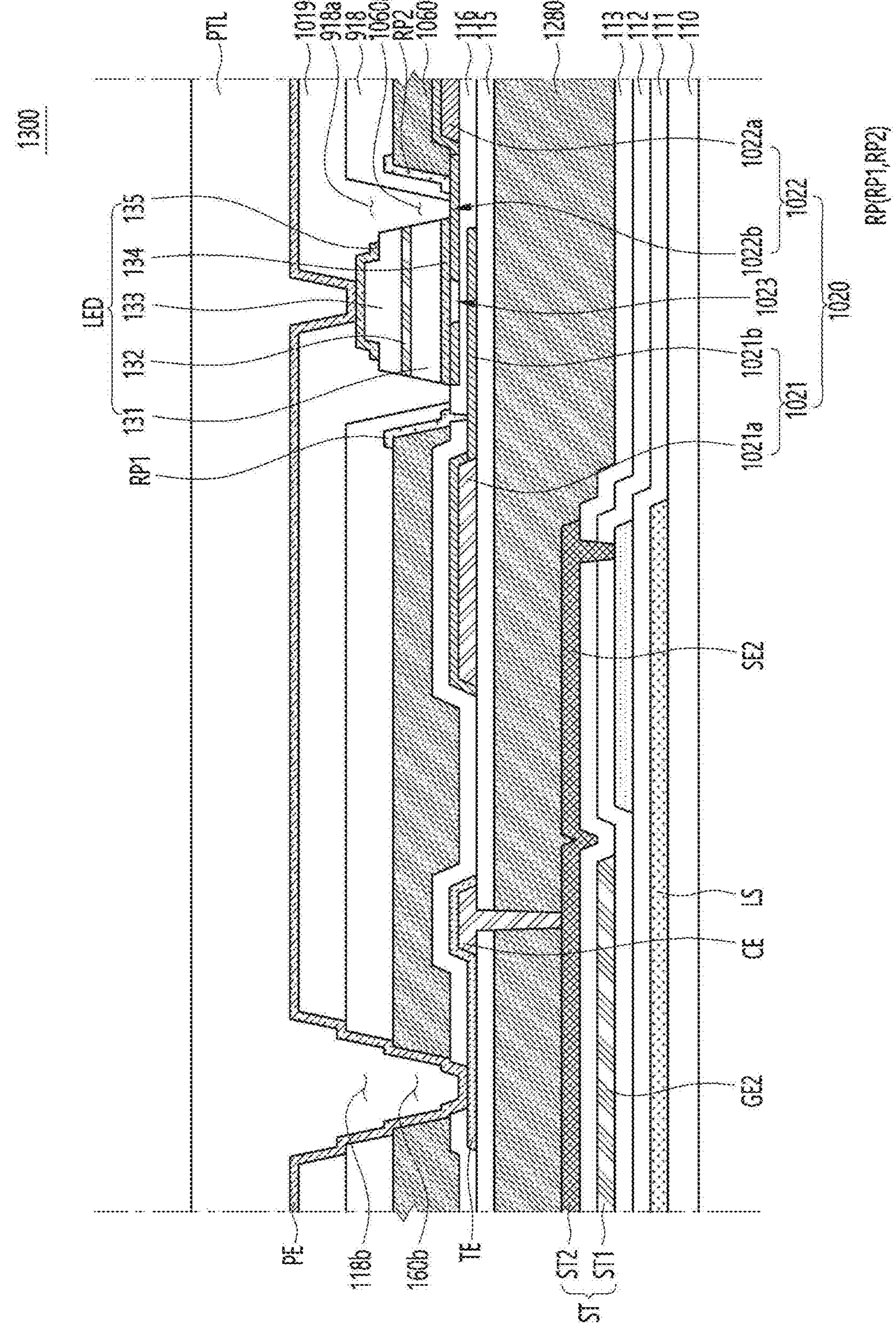

Figure 15:
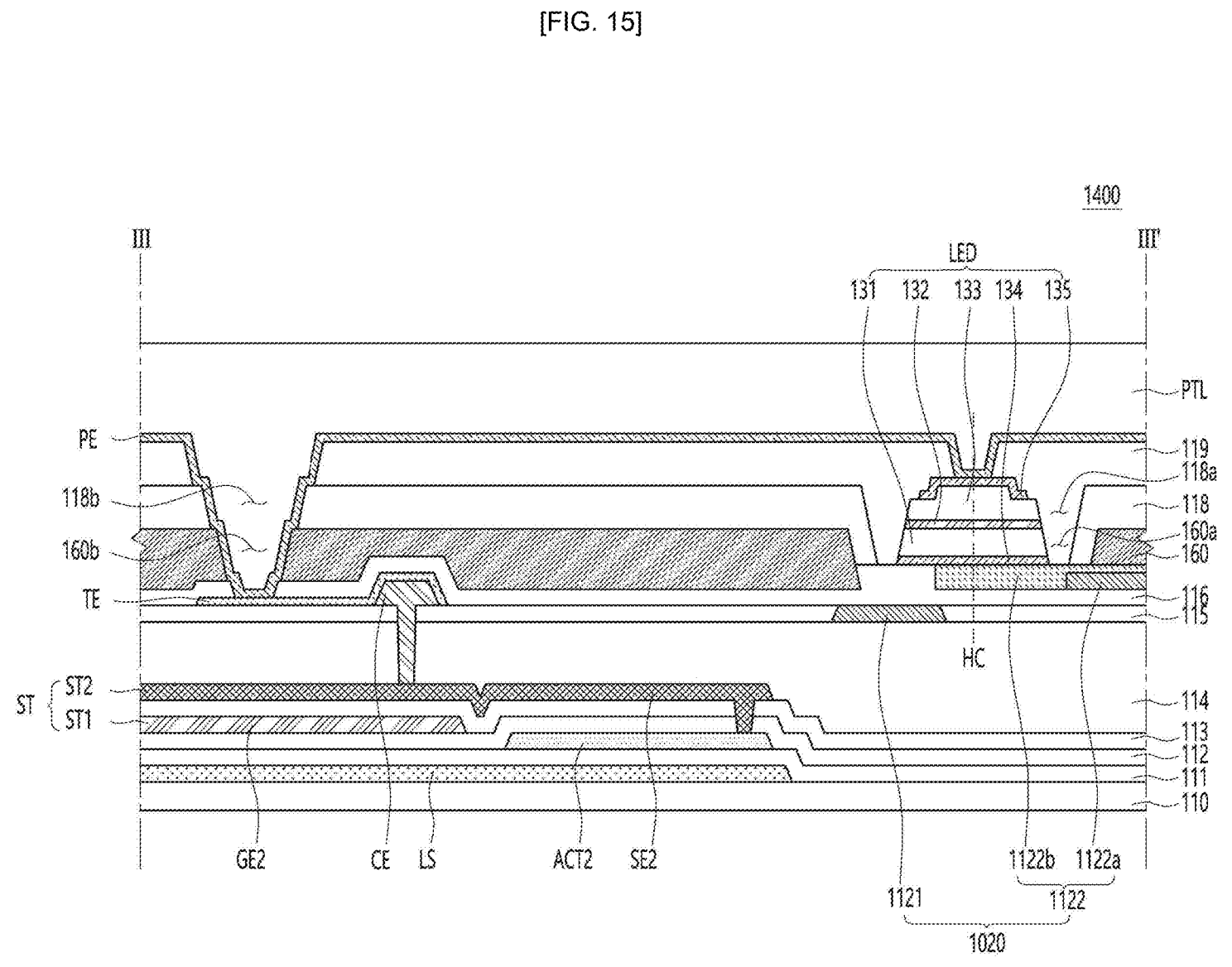

1400
III III'
PTL
119
118a
118
160a
160
116
115
114
113
112
111
110
LED
131 132 133 134 135
HC
1122a
1122b
1122
1121
1020
SE2
ACT2
LS
CE
GE2
PE
118b
160b
TE
ST2
ST1
ST

DISPLAY DEVICE COMPRISING SEMICONDUCTOR LIGHT EMITTING DEVICE IN OPENING HOLE OF PLANARIZATION LAYER

CROSS REFERENCE TO RELATED APPLICATIONS

This application is the National Phase of PCT International Application No. PCT/KR2022/005309, filed on Apr. 12, 2022, which claims priority under 35 U.S.C. 119(a) to Patent Application No. 10-2021-0047309, filed in the Republic of Korea on Apr. 12, 2021, all of which are hereby expressly incorporated by reference into the present application.

TECHNICAL FIELD

The embodiment relates to a display device, and more specifically, to a display device using a semiconductor light emitting device.

BACKGROUND ART

Display devices used in computer monitors, TVs, mobile phones, etc. include Organic Light Emitting Displays that emit light, Liquid Crystal Displays (LCDs) that require a separate light source or micro-LED displays.

A micro-LED display is a display that uses micro-LED, a semiconductor light emitting device with a diameter or cross-sectional area of 100 μm or less, as a display device.

Because micro-LED displays use micro-LED, a semiconductor light emitting device, as a display device, the micro-LED displays have excellent performance in many characteristics such as contrast ratio, response speed, color gamut, viewing angle, brightness, resolution, lifespan, luminous efficiency, or luminance.

In particular, the micro-LED display has the advantage of being able to freely adjust the size and resolution and implement a flexible display because the screen can be separated and combined in a modular manner.

However, because large micro-LED displays require more than millions of micro-LEDs, there is a technical problem that makes it difficult to quickly and accurately transfer micro-LEDs to the display panel. Meanwhile, methods for transferring the semiconductor light emitting device to a substrate include a pick and place process, a laser lift-off method, or a self-assembly method.

Among these, the self-assembly method is a method in which the semiconductor light emitting device finds its assembly position within the fluid on its own, and is an advantageous method for implementing a large-screen display device.

Meanwhile, when a light emitting device is transferred in a fluid, there is a problem that the assembly wiring is corroded by the fluid. Corrosion of assembly wiring may cause electrical short circuits and assembly defects. Additionally, if the light emitting device is not accurately assembled in the area of the assembly hole and is tilted to one side, the electrical connection with the wiring can become unstable and problems with light emission may occur.

Meanwhile, even if there is no problem with the electrical connection between the light emitting device and the wiring, there is a problem in that light generated from the assembled light emitting device can be emitted randomly without following a specific path. In this case, luminous efficiency may decrease, resulting in decreased luminance, viewing angle, and brightness of light. Additionally, a problem may occur in which the metal electrode within the substrate reflects external light, impairing the visibility of the display device.

DISCLOSURE

Technical Problem

The technical object of the embodiment is to provide a display device that can prevent reflection of external light using a light absorption layer.

Additionally, a technical object of the embodiment is to provide a display device capable of improving viewing angle and side luminance.

Additionally, the technical object of the embodiment is to provide a display device that can reduce process costs by simplifying the process of forming the light absorption layer and the planarization layer.

Additionally, a technical object of the embodiment is to provide a display device that can improve the stability of the transistor.

Additionally, the technical object of the embodiment is to provide a display device that can improve the concentration efficiency of light emitted from a light emitting device.

In addition, the technical object of the embodiment is to provide a display device in which light emitting devices can be stably assembled by improving assembly control of light emitting devices.

Additionally, the technical object of the embodiment is to provide a display device with enhanced assembly force for light emitting devices.

Additionally, the technical object of the embodiment is to provide a display device that solves the phenomenon of tilting of light emitting devices.

The objects of the embodiment are not limited to the objects mentioned above, but include what can be understood from the specification.

Technical Solution

A display device having a semiconductor light emitting device according to an embodiment includes a substrate, first assembly wiring and second assembly wiring alternately arranged on the substrate and spaced apart from each other, and a planarization layer disposed on the first assembly wiring and the second assembly wiring, having an opening hole and a contact hole; a light emitting device disposed in the opening hole of the planarization layer and having a first electrode overlapping the first assembly wiring and the second assembly wiring; and a first light absorption layer arranged to surround the area where the light emitting device disposed, having light absorption characteristics.

In addition, the embodiment includes a transistor disposed below the first assembly wiring and the second assembly wiring, a connection electrode disposed below the planarization layer, disposed on a top of the transistor and electrically connected to the transistor, and further include a pixel electrode that electrically connects the connection electrode and the light emitting device through a contact hole of the planarization layer.

The first light absorption layer is disposed between the planarization layer, the first assembly wiring, and the second assembly wiring, and may have an opening area and a contact hole that overlap the opening hole and the contact hole of the planarization layer.

The planarization layer can be arranged to surround top and side surfaces of the first light absorption layer.

The planarization layer can include a first planarization layer surrounding top surface and side surfaces of the first light absorption layer and a second planarization layer surrounding the top surface and side surfaces of the first planarization layer and covering a portion of the top surface of the light emitting device.

Additionally, the embodiment may further include a transparent electrode disposed on the connection electrode to electrically connect the connection electrode and the pixel electrode and transparent electrode being made of a transparent conductive material.

The first light absorption layer can include a contact area that overlaps the contact hole of the planarization layer.

The contact hole of the planarization layer and the contact area of the first light absorption layer may expose the transparent electrode disposed on the connection electrode.

The transparent electrode extends from a top of the connection electrode to the outside of the connection electrode, and the contact hole of the planarization layer and the contact hole of the first light absorption layer can be disposed on the extended portion of the transparent electrode.

Additionally, the embodiment may further include at least one of a second light absorption layer disposed on the pixel electrode and a third light absorption layer disposed under the first assembly wiring and the second assembly wiring.

Additionally, in an embodiment, the substrate can include a display area and a non-display area, and the third light absorption layer can be disposed on at least the entire display area.

The first assembly wiring may vertically overlap the second assembly wiring, and the second assembly wiring can include an electrode hole in a region that vertically overlaps the first assembly wiring.

The first light absorption layer is disposed on the planarization layer and may have an opening area that overlaps an opening hole of the planarization layer.

Additionally, the embodiment may further include a reflector disposed to surround the light emitting device.

The planarization layer can include a first planarization layer disposed on the first assembly wiring and the second assembly wiring, and a second planarization layer disposed on the first planarization layer.

The reflector can be disposed on a side of the first planarization layer.

Additionally, the embodiment may further include a third reflector between the second assembly wiring and the light emitting device.

The second assembly wiring is disposed to extend beyond a center of the assembly hole, and can be disposed on a different plane from the first assembly wiring.

In addition, a display device having a semiconductor light emitting device according to an embodiment can include an assembly wiring disposed on a substrate, a light emitting device disposed on the assembly wiring, and a planarization layer disposed on the assembly wiring and surrounding the light emitting device. The display device can include a light absorption layer arranged to surround the planarization layer and the light emitting device and having light absorption characteristics.

The light absorption layer can be disposed between the assembly wiring and the planarization layer.

The planarization layer can include a first planarization layer disposed to surround side and top surfaces of the light absorption layer and a second planarization layer disposed to surround side and top surfaces of the first planarization layer.

The planarization layer may further include a first opening hole, which is an area formed by overlapping the opening areas of the light absorption layer and the first planarization layer to overlap the assembly wiring.

The light emitting device can be disposed in the first opening hole.

In addition, the embodiment includes a connection electrode disposed between the transistor and the planarization layer and electrically connected to the transistor, and a pixel disposed on a top of the connection electrode and the light emitting device and electrically connected to the connection electrode and the light emitting device. The embodiment may further include a second opening hole disposed to penetrate the electrode, the light absorption layer, and the first planarization layer and electrically connecting the connection electrode and the pixel electrode.

The planarization layer can include a first planarization layer disposed to surround side and top surfaces of the light absorption layer and a second planarization layer disposed to surround side and top surfaces of the first planarization layer.

Additionally, the embodiment may further include a reflector disposed on a side of the light absorption layer and reflecting light emitted from the light emitting device.

The assembly wiring can include a conductive layer and a clad layer disposed in contact with the conductive layer at a layer different from the conductive layer and extending to an area outside the conductive layer.

The light emitting device can be arranged to overlap the extended area of the clad layer.

The assembly wiring can include a first assembly wiring and a second assembly wiring disposed above the first assembly wiring.

In addition, the embodiment includes a first jumping wire disposed on a different layer from the second assembly wiring and electrically connected to the second assembly wiring, and a second jumping wire disposed below the light emitting device and electrically connected to the light emitting device.

The second assembly wiring can be electrically connected to the light emitting device through the first jumping wiring and the second jumping wiring.

Advantageous Effects

According to the embodiment, since the light absorption layer absorbs external light, preventing reflection of external light by metal electrodes, the embodiment has the technical effect of improving visibility of the display device.

For example, external light reflection due to a contact hole can be minimized by placing a light absorption layer on the pixel electrode.

Additionally, the embodiment has the technical effect of improving the viewing angle and lateral brightness of the display device by changing the position of the light absorption layer.

For example, by making the height of the light absorption layer lower than the top surface of the light emitting device, light can escape upward.

In addition, according to the embodiment, the light absorption layer also functions as a planarization layer, so a separate process for forming the light absorption layer is not required, so there is technical effect in that the manufacturing process can be simplified and the process cost can be reduced.

In addition, the embodiment has the technical effect of blocking light emitted from the light emitting device toward the active layer containing an oxide semiconductor material, thereby minimizing deterioration of the active layer by light emitted from the light emitting device.

In addition, the embodiment has the technical effect of concentrating light emitted from the light emitting device and improving the brightness of the display device by arranging the reflector to surround the light emitting device.

For example, a light path can be changed to the outside of the display device by placing reflectors on the side and bottom of the light emitting device.

Additionally, the embodiment has the technical effect of improving assembly control of the light emitting device by connecting the reflector arranged to surround the light emitting device to the assembly wiring.

Additionally, the embodiment has the technical effect of strengthening the assembly force for light emitting devices.

For example, the self-assembly force can be strengthened by arranging the assembly wiring in a vertically symmetrical structure to strengthen the dielectrophoresis force.

Effects according to the embodiment are not limited to the content exemplified above, and more diverse effects are included in the embodiment.

DESCRIPTION OF DRAWINGS

FIG. 1 is a schematic plan view of a display device according to an embodiment.

FIG. 2 is a schematic enlarged plan view of a display device according to an embodiment.

FIG. 3 is a cross-sectional view taken along line III-III' of FIG. 2.

FIGS. 4A to 4F are process drawings for explaining a manufacturing method of a display device according to an embodiment.

FIG. 5 is a cross-sectional view of a display device according to a second embodiment.

FIG. 6 is a cross-sectional view of a display device according to a third embodiment.

FIG. 7 is a cross-sectional view of a display device according to a fourth embodiment.

FIG. 8 is a cross-sectional view of a display device according to a fifth embodiment.

FIG. 9 is a cross-sectional view of a display device according to a sixth embodiment.

FIG. 10 is a cross-sectional view of a display device according to a seventh embodiment.

FIG. 11 is a cross-sectional view of a display device according to an eighth embodiment.

FIG. 12 is a cross-sectional view of a display device according to a ninth embodiment.

FIG. 13 is a cross-sectional view of a display device according to the tenth embodiment.

FIG. 14 is a perspective view showing assembly wiring according to the eleventh embodiment.

FIG. 15 is a cross-sectional view of a display device according to the twelfth embodiment.

MODE FOR INVENTION

Hereinafter, embodiments disclosed in this specification will be described in detail with reference to the attached drawings. The suffixes 'module' and 'part' for elements used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, region or substrate is referred to as being 'on' another element, this includes either directly on the other element or there can be other intermediate elements there between.

Display devices described in this specification include digital TVs, mobile phones, smart phones, laptop computers, digital broadcasting terminals, personal digital assistants (PDAs), portable multimedia players (PMPs), navigation, slate PCs, tablet PCs, ultra-books, or desktop computers, etc. However, the feature according to the embodiment described in this specification can be applied to a device capable of displaying even if it is a new product type that is developed in the future.

Hereinafter, embodiments will be described with reference to the drawings.

FIG. 1 is a schematic plan view of a display device according to an embodiment. For convenience of explanation, only the substrate 110 and the plurality of sub-pixels SP among the various elements of the display device 100 are shown in FIG. 1.

The display device 100 according to an embodiment can include a flexible display manufactured on a thin and flexible substrate. Flexible displays can bend or curl like paper while maintaining the characteristics of existing flat displays.

In a flexible display, visual information can be implemented by independently controlling the light emission of unit pixels arranged in a matrix form. A unit pixel refers to the minimum unit for implementing one color. A unit pixel of a flexible display can be implemented by a light emitting device. In the embodiment, the light emitting device can be Micro-LED or Nano-LED, but is not limited thereto.

The substrate 110 can support various elements included in the display device 100 and can be made of an insulating material. For example, the substrate 110 can be made of glass or resin. Additionally, the substrate 110 can include polymer or plastic, or can be made of a material with flexibility.

The substrate 110 can include a display area AA and a non-display area NA.

The display area AA is an area where a plurality of sub-pixels SP are arranged and an image is displayed. Each of the plurality of sub-pixels SP is an individual unit that emits light, and a semiconductor light emitting device LED and a driving circuit are formed in each of the plurality of sub-pixels SP. For example, the plurality of sub-pixels SP can include a red sub-pixel, a green sub-pixel, a blue sub-pixel, and/or a white sub-pixel, but are not limited to. Hereinafter, the description will be made on the assumption that the plurality of sub-pixels SP includes a red sub-pixel, a green sub-pixel, and a blue sub-pixel, but is not limited thereto.

The non-display area NA is an area where images are not displayed, and is an area where various wiring, driver ICs, etc. for driving the sub-pixels SP arranged in the display area AA are placed. For example, various ICs such as gate driver ICs and data driver ICs and driving circuits can be placed in the non-display area NA. Meanwhile, the non-display area NA can be located on a back of the substrate 110, that is, on the portion without the sub-pixel SP, or can be omitted, and is not limited to what is shown in the drawing.

The display device 100 of the embodiment can drive the light emitting device using an active matrix AM method or a passive matrix PM method.

Hereinafter, FIGS. 2 and 3 will be referred to together for a more detailed description of the plurality of sub-pixels SP.

FIG. 2 is a schematic enlarged plan view of a display device according to an embodiment. FIG. 3 is a cross-sectional view taken along line III-III' of FIG. 2.

Referring to FIGS. 2 and 3, the display device 100 according to the embodiment includes a plurality of scan wires SL, a plurality of data wires DL, a plurality of high potential power supply wires VDD, and a plurality of assembly wires. 120 and a first transistor TR1, a second transistor TR2, a third transistor TR3, a storage capacitor ST, and a semiconductor light emitting device of each of the plurality of reference lines RL and the plurality of sub-pixels SP. Device LED, light blocking layer LS, buffer layer 111, gate insulating layer 112, a plurality of passivation layers (113, 115, 116), a lower planarization layer 114, a plurality of planarization layers 118, 119, a connection electrode CE, a transparent electrode TE, a first light absorption layer 160, and a pixel electrode PE.

Referring to FIGS. 2 and 3, a plurality of data wires DL, a first layer VDD1 and a second layer VDD2 of the high-potential power wire VDD, a plurality of reference wires RL, and a plurality of assembly lines 120 extend in the column direction between the plurality of sub-pixels SP, and the third layer VDD3 of the plurality of scan wirings SL and the high potential power supply wiring VDD is connected to the plurality of sub-pixels SP. It may extend in the row direction between. Additionally, a first transistor TR1, a second transistor TR2, a third transistor TR3, and a storage capacitor ST can be disposed in each of the plurality of sub-pixels SP.

First, the first layer VDD1 and the light blocking layer LS of the high-potential power line VDD can be disposed on the substrate 110.

The high-potential power supply line VDD is a line that transmits a high-potential power supply voltage to each of the plurality of sub-pixels SP. A plurality of high-potential power supply lines VDD may transmit a high-potential power supply voltage to the second transistor TR2 of each of the plurality of sub-pixels SP.

Meanwhile, the plurality of high-potential power supply wires VDD can be made of a single layer or multiple layers. For convenience of explanation, hereinafter, the description will be made on the assumption that the plurality of high-potential power supply wires VDD are made of a plurality of layers.

The high potential power wiring VDD includes a plurality of first layers VDD1, a plurality of second layers VDD2, and a plurality of third layers VDD3 connecting them. The first layer VDD1 may extend in the column direction between each of the plurality of sub-pixels SP.

A light blocking layer LS can be disposed on each of the plurality of sub-pixels SP on the substrate 110. The light blocking layer LS can minimize leakage current by blocking light incident from the lower part of the substrate 110 to the second active layer ACT2 of the second transistor TR2, which will be described later.

The buffer layer 111 can be disposed on the first layer VDD1 and the light blocking layer LS of the high-potential power line VDD. The buffer layer 111 can reduce penetration of moisture or impurities through the substrate 110. The buffer layer 111 can be composed of, for example, a single layer or a multiple layer of silicon oxide $SiO_x$ or silicon nitride $SiN_x$, but is not limited thereto. However, the buffer layer 111 can be omitted depending on the type of substrate 110 or the type of transistor, but is not limited thereto.

A plurality of scan wires SL, a plurality of reference wires RL, a plurality of data wires DL, a first transistor TR1, a second transistor TR2, a third transistor TR3, and a storage capacitor ST can be disposed on the buffer layer 111.

First, the first transistor TR1 is disposed in each of the plurality of sub-pixels SP. The first transistor TR1 includes a first active layer ACT1, a first gate electrode GE1, a first source electrode SE1, and a first drain electrode DE1. The first active layer ACT1 can be disposed on the buffer layer 111. The first active layer ACT1 can be made of a semiconductor material such as oxide semiconductor, amorphous silicon, or polysilicon, but is not limited thereto.

The gate insulating layer 112 can be disposed on the first active layer ACT1. The gate insulating layer 112 is an insulating layer for insulating the first active layer ACT1 and the first gate electrode GE1, and can be composed of a single layer or multiple layers of silicon oxide $SiO_x$ or silicon nitride $SiN_x$, but it is not limited to this.

The first gate electrode GE1 can be disposed on the gate insulating layer 112. The first gate electrode GE1 can be electrically connected to the scan line SL. The first gate electrode GE1 can be made of a conductive material, such as copper Cu, aluminum Al, molybdenum Mo, nickel Ni, titanium Ti, chromium Cr, or an alloy thereof, but is not limited to thereto.

The first passivation layer 113 can be disposed on the first gate electrode GE1. Contact holes can be formed in the first passivation layer 113 to connect the first source electrode SE1 and the first drain electrode DE1 to the first active layer ACT1. The first passivation layer 113 is an insulating layer to protect the structure below the first passivation layer 113, and can be composed of a single layer or multiple layers of silicon oxide $SiO_x$ or silicon nitride $SiN_x$, but is limited thereto.

The first source electrode SE1 and the first drain electrode DE1 electrically connected to the first active layer ACT1 can be disposed on the first passivation layer 113. The first drain electrode DE1 can be connected to the data line DL, and the first source electrode SE1 can be connected to the second gate electrode GE2 of the second transistor TR2. The first source electrode SE1 and the first drain electrode DE1 are made of a conductive material, for example, copper Cu, aluminum Al, molybdenum Mo, nickel Ni, titanium Ti, chromium Cr or an alloy thereof, but is not limited thereto.

Meanwhile, in the embodiment, each of the first source electrode SE1 and the first drain electrode DE1 is described as being connected to the second gate electrode GE2 and the data line DL, but depending on the type of transistor, the first source electrode SE1 can be connected to the data line DL, and the first drain electrode DE1 can be connected to the second gate electrode GE2 of the second transistor TR2, but are not limited thereto.

The first gate electrode GE1 of the first transistor TR1 is connected to the scan line SL and can be turned on or off depending on the scan signal. The first transistor TR1 may transfer a data voltage to the second gate electrode GE2 of the second transistor TR2 based on the scan signal, and can be referred to as a switching transistor.

Meanwhile, a plurality of data lines DL and a plurality of reference lines RL along with the first gate electrode GE1 can be disposed on the gate insulating layer 112. The plurality of data lines DL and the reference lines RL can be formed of the same material and process as the first gate electrode GE1.

The plurality of data lines DL are lines that transmit data voltages to each of the plurality of sub-pixels SP. The plurality of data lines DL may transmit data voltage to the first transistor TR1 of each of the plurality of sub-pixels SP. For example, the plurality of data lines DL include a data line DL that transmits the data voltage to the red sub-pixel SPR, a data line DL that transmits the data voltage to the green sub-pixel SPG, and a blue sub-pixel DL that transmits the data voltage to the red sub-pixel SPR. It can be composed of a data line DL that transmits a data voltage to the pixel SPB.

The plurality of reference wires RL are wires that transmit a reference voltage to each of the plurality of sub-pixels SP. The plurality of reference lines RL may transmit a reference voltage to the third transistor TR3 of each of the plurality of sub-pixels SP.

A second transistor TR2 can be disposed in each of the plurality of sub-pixels SP. The second transistor TR2 includes a second active layer ACT2, a second gate electrode GE2, a second source electrode SE2, and a second drain electrode DE2. The second active layer ACT2 can be disposed on the buffer layer 111. The second active layer ACT2 can be made of a semiconductor material such as oxide semiconductor, amorphous silicon, or polysilicon, but is not limited thereto.

The gate insulating layer 112 can be disposed on the second active layer ACT2, and the second gate electrode GE2 can be disposed on the gate insulating layer 112. The second gate electrode GE2 can be electrically connected to the first source electrode SE1 of the first transistor TR1. The second gate electrode GE2 is made of a conductive material, such as copper Cu, aluminum Al, molybdenum Mo, nickel Ni, titanium Ti, chromium Cr, or an alloy, but is not limited to thereto.

The first passivation layer 113 can be disposed on the second gate electrode GE2, and the second source electrode SE2 and the second drain electrode DE2 can be disposed on the first passivation layer 113. The second source electrode SE2 is electrically connected to the second active layer ACT2. The second drain electrode DE2 can be electrically connected to the second active layer ACT2 and at the same time can be electrically connected to the high potential power supply line VDD. The second drain electrode DE2 can be disposed between the first layer VDD1 and the second layer VDD2 of the high potential power line VDD and electrically connected to the high potential power line VDD.

The second transistor TR2 has a second gate electrode GE2 connected to the first source electrode SE1 of the first transistor TR1, and can be turned on by the data voltage transmitted when the first transistor TR1 is turned on. And the turned-on second transistor TR2 can transfer a driving current to the light emitting device LED based on the high-potential power supply voltage from the high-potential power supply line VDD, and thus can be referred to as a driving transistor.

A third transistor TR3 can be disposed in each of the plurality of sub-pixels SP. The third transistor TR3 includes a third active layer ACT3, a third gate electrode GE3, a third source electrode SE3, and a third drain electrode DE3. The third active layer ACT3 can be disposed on the buffer layer 111. The third active layer ACT3 can be made of a semiconductor material such as an oxide semiconductor, amorphous silicon, or polysilicon, but is not limited thereto.

The gate insulating layer 112 is disposed on the third active layer ACT3, and the third gate electrode GE3 is disposed on the gate insulating layer 112. The third gate electrode GE3 is connected to the scan line SL, and the third transistor TR3 can be turned on or off by the scan signal. The third gate electrode GE3 is made of a conductive material, such as copper Cu, aluminum Al, molybdenum Mo, nickel Ni, titanium Ti, chromium Cr, or an alloy thereof, but is not limited to thereto.

However, although it is explained that the third gate electrode GE3 and the first gate electrode GE1 are connected to the same scan line SL, the third gate electrode GE3 can be connected to a different scan line SL from the first gate electrode, but is not limited to this.

The first passivation layer 113 can be disposed on the third gate electrode GE3, and the third source electrode SE3 and the third drain electrode DE3 can be disposed on the first passivation layer 113. The third source electrode SE3 is formed integrally with the second source electrode SE2, is electrically connected to the third active layer ACT3, and is electrically connected to the second source electrode SE2 of the second transistor TR2. And the third drain electrode DE3 can be electrically connected to the reference wiring RL.

The third transistor TR3 can be electrically connected to the second source electrode SE2, the reference line RL, and the storage capacitor ST of the second transistor TR2, which is a driving transistor. The third transistor TR3 can be referred to as a sensing transistor.

A storage capacitor ST can be disposed in each of the plurality of sub-pixels SP. The storage capacitor ST includes a first capacitor electrode ST1 and a second capacitor electrode ST2. The storage capacitor ST is connected between the second gate electrode GE2 and the second source electrode SE2 of the second transistor TR2, and stores the voltage while the light emitting device LED emits light. The voltage level of the gate electrode of second transistor TR2 can be maintained constant.

The first capacitor electrode ST1 can be integrated with the second gate electrode GE2 of the second transistor TR2. Accordingly, the first capacitor electrode ST1 can be electrically connected to the second gate electrode GE2 of the second transistor TR2 and the first source electrode SE1 of the first transistor TR1.

The second capacitor electrode ST2 can be disposed on the first capacitor electrode ST1 with the first passivation layer 113 interposed therebetween. The second capacitor electrode ST2 can be integrated with the second source electrode SE2 of the second transistor TR2 and the third source electrode SE3 of the third transistor TR3. Accordingly, the second capacitor electrode ST2 can be electrically connected to the second transistor TR2 and the third transistor TR3.

Meanwhile, the first source electrode SE1, the first drain electrode DE1, the second source electrode SE2, the second drain electrode (DE2), the third source electrode SE3, the third drain electrode (DE3) and a plurality of scan lines SL are disposed on the first passivation layer 113 along with the second capacitor electrode ST2.

The plurality of scan wires SL are wires that transmit scan signals to each of the plurality of sub-pixels SP. The plurality of scan lines SL may transmit scan signals to the first transistor TR1 of each of the plurality of sub-pixels SP. For example, each of the plurality of scan lines SL extends in the row direction and can transmit a scan signal to a plurality of sub-pixels SP arranged in the same row:

Next, the lower planarization layer 114 includes a plurality of scan lines SL, a plurality of reference lines RL, a plurality of data lines DL, a first transistor TR1, a second transistor TR2, and a third transistor TR2. the lower planarization layer 114 can be disposed on the transistor TR3 and the storage capacitor ST. The lower planarization layer 114 may planarize the upper part of the substrate 110 on which the plurality of transistors are disposed. The lower planarization layer 114 can be composed of a single layer or a double layer, and can be made of, for example, an acryl-based organic material, but is not limited thereto.

The second passivation layer 115 can be disposed on the lower planarization layer 114. The second passivation layer 115 is an insulating layer to protect the structure below the second passivation layer 115 and improve the adhesion of the structure formed on the second passivation layer 115, and is made of silicon oxide SiOx or can be composed of a single layer or multiple layers of silicon nitride SiNx, but is not limited thereto.

The second layer VDD2 of the high-potential power supply wiring VDD, the plurality of first assembly wirings 121 among the plurality of assembly wiring lines 120, and the connection electrode CE are disposed on the second passivation layer 115.

First, the plurality of assembly wirings 120 generate an electric field to align the plurality of light emitting devices LEDs when manufacturing the display device 100, and can be wirings that supply low-potential power supply voltage when the display device 100 is driven. Accordingly, the assembly wiring 120 can be referred to as a low-potential power wiring. The plurality of assembly wirings 120 are arranged in a column direction along the plurality of sub-pixels SP arranged on the same line. The plurality of assembly wirings 120 can be arranged to overlap the plurality of sub-pixels SP arranged in the same column. For example, one first assembly wiring 121 and a second assembly wiring 122 can be disposed in the red sub-pixel SPR arranged in the same column, and one first assembly wiring 121 and one second assembly wiring 122 can be disposed in the green sub-pixel SPG. And one first assembly wiring 121 and a second assembly wiring 122 can be disposed in the blue sub-pixel SPB.

The plurality of assembly wiring lines 120 includes a plurality of first assembly wiring lines 121 and a plurality of second assembly wiring lines 122. A plurality of transistors can be disposed below the plurality of first assembly wirings 121 and the plurality of second assembly wirings 122, and when the display device 100 is driven, a low-potential voltage can be applied to the plurality of first assembly wirings 121 and the plurality of second assembly wirings 122 in alternating current. The plurality of first assembly wires 121 and the plurality of second assembly wires 122 can be alternately arranged. Additionally, in each of the plurality of sub-pixels SP, one first assembly wiring 121 and one second assembly wiring 122 can be disposed adjacent to each other.

The plurality of first assembly wirings 121 and the plurality of second assembly wirings 122 can be made of a conductive material, for example, copper Cu and chromium Cr, but are not limited thereto.

The second layer VDD2 of the high-potential power supply line VDD can be disposed on the second passivation layer 115. The second layer VDD2 is located between each of the plurality of sub-pixels SP in the column direction and extends to and may overlap with the first layer VDD1. The first layer VDD1 and the second layer VDD2 can be electrically connected through a contact hole formed in the insulating layers formed between the first layer VDD1 and the second layer VDD2. The second layer VDD2 can be formed of the same material and process as the first assembly wiring 121, but is not limited thereto.

A connection electrode CE can be disposed in each of the plurality of sub-pixels SP. The plurality of connection electrodes CE can be disposed on top of the second plurality of transistors TR2 and can be electrically connected to the second plurality of transistors TR2. Specifically, the connection electrode CE can be electrically connected to the second capacitor electrode ST2 and the second source electrode SE2 of the second transistor TR2 through a contact hole formed in the second passivation layer 115. The connection electrode CE is an electrode for electrically connecting the light emitting device LED and the second transistor TR2, which is a driving transistor, and is made of the same material on the same layer as the first assembly wiring 121.

The transparent electrode TE can be disposed on the connection electrode CE. The transparent electrode TE can be disposed on the connection electrode CE to electrically connect the connection electrode CE and the light emitting device LED. The transparent electrode TE can be arranged to extend from a top of the connection electrode CE to the outside of the connection electrode CE. That is, a part of the transparent electrode TE may overlap the connection electrode CE, and another part of the transparent electrode TE can be extended to a position that does not overlap the connection electrode CE. The transparent electrode TE can be formed of a transparent conductive material. The transparent electrode TE can be formed of, for example, Indium Tin Oxide ITO, but is not limited thereto.

Next, the third passivation layer 116 is disposed on the second layer VDD2, the first assembly wiring 121, the connection electrode CE, and the transparent electrode TE. The third passivation layer 116 is an insulating layer to protect the structure below the third passivation layer 116, and can be composed of a single layer or multiple layers of silicon oxide $SiO_x$ or silicon nitride SiNx, but is limited thereto. In addition, the third passivation layer 116 may function as an insulating layer to prevent short circuit defects due to migration between the first assembly wiring 121 and the second assembly wiring 122 when manufacturing the display device 100. This will be described later with reference to FIGS. 4A to 4F.

Among the plurality of assembly wiring lines 120, the plurality of second assembly wiring lines 122 can be disposed on the third passivation layer 116. Each of the plurality of second assembly wirings 122 is disposed in a plurality of sub-pixels SP arranged on the same line as described above, and the plurality of first assembly wirings 121 and the plurality of second assembly wirings 122 can be placed spaced apart from each other.

Each of the plurality of second assembly wirings 122 includes a second conductive layer 122*a* and a second clad layer 122*b*. The second conductive layer 122*a* can be disposed on the third passivation layer 116. And the second clad layer 122*b* can be electrically connected to the second conductive layer 122*a*. For example, the second clad layer 122*b* can be disposed to cover the top and side surfaces of the second conductive layer 122*a*. And the second conductive layer 122*a* may have a thickness greater than that of the second clad layer 122*b*.

The second clad layer 122*b* is made of a material that is more resistant to corrosion than the second conductive layer 122*a*, so that there is a technical effect that can minimize short circuit defects occurrence due to migration between the first assembly wiring 121 and the second assembly wiring 122 when manufacturing the display device 100. For example, the second clad layer 122*b* can be made of molybdenum Mo, molybdenum titanium MoTi, etc., but is not limited thereto.

Next, the first light absorption layer 160 can be disposed on the plurality of first assembly wiring lines 121 and the plurality of second assembly wiring lines 122. Specifically, the first light absorption layer 160 can be disposed on the third passivation layer 116 and the plurality of second assembly lines 122. The first light absorption layer 160 is arranged to surround the area where the light emitting device LED is placed, and has the technical effect of flattening the area where the light emitting device LED is placed. Accordingly, the first light absorption layer 160 may also function as a planarization layer.

The first light absorption layer 160 includes an opening area 118*a* and a contact hole 160*b*, and a light emitting device LED can be disposed within the opening area 118*a* of the first light absorption layer 160. The contact hole 160*b* of the first light absorption layer 160 exposes an extended portion of the transparent electrode TE extending from the top of the connection electrode CE to the outside of the connection electrode CE. Accordingly, the light emitting device LED and the transistor can be electrically connected by connecting the exposed portion of the pixel electrode PE, which will be described later, with the transparent electrode TE.

The first light absorption layer 160 can reduce color mixing between the plurality of sub-pixels SP and reduce external light reflection. In addition, the first light absorption layer 160 allows light emitted from the light emitting device LED to pass through the first active layer ACT1 of the first transistor TR1, the second active layer ACT2 of the second transistor TR2, and there is a technical effect of blocking incident light on the third active layer ACT3 of the third transistor TR3.

If the first active layer ACT1, the second active layer ACT2, and the third active layer ACT3 are made of an oxide semiconductor, the first active layer ACT1, the second active layer ACT2, and the third active layer ACT3 can be deteriorated by light incident on the first active layer ACT1, the second active layer ACT2, and the third active layer ACT3. Accordingly, the first light absorption layer 160 is arranged to surround the area where the light emitting device LED is disposed, so that the light emitted from the light emitting device LED flows into the first active layer ACT1 and the second active layer ACT2. So there is a technical effect of blocking incident light on the third active layer ACT3.

Referring to FIG. 3, the top surface of the first light absorption layer 160 is located lower than the top surface of the plurality of light emitting devices LEDs. Accordingly, the viewing angle of the display device 100 can be improved. Specifically, the first light absorption layer ACT3 is arranged to reduce color mixing between the plurality of sub-pixels SP and minimize external light reflection, but may also absorb light emitted from the light emitting device LED.

At this time, if the top surface of the first light absorption layer 160 is located higher than the top surface of the light emitting device LED, light emitted toward the top of the light emitting device LED can be absorbed from the first light absorption layer 160. Accordingly the upper surface of the first light absorption layer 160 can be disposed at a lower position than the upper surface of the light emitting device LED, so there is a technical effect in that the lateral luminance with respect to the light emitted from the light emitting device LED can be improved, and the viewing angle of the display device 100 is improved.

The first light absorption layer 160 can be made of a material having light absorption properties. For example, the first light absorption layer 160 can be made of an opaque material, for example, black resin, but is not limited thereto.

The first planarization layer 118 can be disposed on the first light absorption layer 160. Specifically, the first planarization layer 118 is disposed on the plurality of first assembly wirings 121, the plurality of second assembly wirings 122, the connection electrode CE, and the first light absorption layer 160, so the first planarization layer 118 can be arranged to surround the top and side surfaces of the light absorption layer 160. Accordingly, the first light absorption layer 160 can be disposed between the first planarization layer 118 and the plurality of first assembly wirings 121 and the plurality of second assembly wirings 122. The first planarization layer 118 can be composed of a single layer or a double layer, and can be made of, for example, an acryl-based organic material, but is not limited thereto.

The first planarization layer 118 has a plurality of opening holes 118*a* on which each of the plurality of light emitting devices LED is seated, and a plurality of contact holes exposing each of the plurality of transparent electrodes TE on the plurality of connection electrodes CE. At this time, the opening hole 118*a* of the first planarization layer 118 overlaps the opening area 160*a* of the first light absorption layer 160, and the contact hole 118*b* of the first planarization layer 118 can be arranged to overlap the contact hole 160*b* of the first light absorption layer 160.

The plurality of opening holes 118*a* are parts into which a plurality of light emitting devices LEDs are inserted, and may also be referred to as pockets. The plurality of opening holes 118*a* can be formed to overlap the plurality of assembly wires 120. For example, one opening hole 118*a* may overlap the first assembly wiring 121 and the second assembly wiring 122 disposed adjacent to each other in one sub-pixel SP.

Additionally, a portion of the second clad layer 122*b* of the plurality of second assembly wirings 122 can be exposed through the opening hole 118*a*. On the other hand, since the third passivation layer 116 covers all of the first assembly wiring 121 in the opening hole 118*a*, the first assembly wiring 121 overlaps the opening hole 118*a* but is not exposed from the opening hole 118*a*.

A plurality of contact holes 118*b* are disposed in the plurality of sub-pixels SP. The plurality of contact holes 118*b* expose the extended portion of the transparent electrode TE on the connection electrode CE of each of the plurality of sub-pixels SP. The transparent electrode TE under the first planarization layer 118 is exposed through the plurality of contact holes 118*b*, and the connection electrode CE connected to the transparent electrode TE can be electrically connected to the light emitting device LED. Accordingly, the connection electrode CE and the transparent electrode TE can transmit the driving current from the second transistor TR2 to the light emitting device LED. At this time, the first light absorption layer 160, the first planarization layer 118, and the third passivation layer 116 may each have a contact hole in the area overlapping the contact hole 118*b*, and thus the connection electrode CE can be exposed from the first light absorption layer 160, the first planarization layer 118, and the third passivation layer 116.

A plurality of light emitting devices LEDs can be disposed in a plurality of opening holes 118*a*. The plurality of light emitting devices LEDs are light emitting devices LEDs that emit light by electric current. The plurality of light emitting devices LEDs can include light emitting devices LEDs that emit red light, green light, blue light, etc., and a combination of these can produce light of various colors, including white. For example, the light emitting device LED can be a light emitting diode LED or a micro-LED, but is not limited thereto.

Hereinafter, a plurality of light emitting devices LEDs include the red light emitting device 130 arranged in the red sub-pixel SPR, the green light emitting device 140 located in the green sub-pixel SPG, and blue light emitting device 150 arranged in the blue sub-pixel SPB. The description will be made assuming that the blue light emitting device 150. However, the plurality of light emitting devices LEDs are composed of light emitting devices LEDs that emit light of the same color, and a separate light conversion member is used to convert the light from the plurality of light emitting devices LEDs into light of different colors. Thus, images in various colors can be displayed, but are not limited to thereto.

The plurality of light emitting devices LEDs include a red light emitting device 130 disposed in the red sub-pixel SPR, a green light emitting device 140 disposed in the green sub-pixel SPG, and a blue light emitting device 150 disposed in the blue sub-pixel SPB. Each of the red light emitting device 130, the green light emitting device 140, and the blue light emitting device 150 can include a first semiconductor layer, a second semiconductor layer, a first electrode, and a second electrode in common. And the red light emitting device 130 includes a light emitting layer that emits red light, the green light emitting device 140 includes a light emitting layer that emits green light, and the blue light emitting device 150 includes a light emitting layer that emits blue light.

Referring to FIG. 3, the red light emitting device 130 disposed in the red sub-pixel SPR has a second semiconductor layer 133 disposed on the first semiconductor layer 131. The first semiconductor layer 131 and the second semiconductor layer 133 can be layers formed by doping n-type and p-type impurities into a specific material. For example, the first semiconductor layer 131 and the second semiconductor layer 133 can include an AlInGaP-based semiconductor layer, for example, indium aluminum phosphide (InAlP), gallium arsenide (GaAs), etc. It can be a layer doped with type p-type or n-type impurities. The p-type impurities can be magnesium (Mg), zinc (Zn), beryllium (Be), etc., and the n-type impurities can be silicon (Si), germanium (Ge), tin (Sn), etc., but are not limited thereto.

A light emitting layer 132 that emits red light is disposed between the first semiconductor layer 131 and the second semiconductor layer 133. The light emitting layer 132 may emit light by receiving holes and electrons from the first semiconductor layer 131 and the second semiconductor layer 133. The light emitting layer 132 may have a single-layer or multi-quantum well (MQW) structure. The light emitting layer 132 converts injected electrical energy into light with a specific wavelength within the range of about 570 nm to about 630 nm. The change in specific wavelength is determined by the size of the band gap of the light emitting diode. The band gap size can be adjusted by changing the composition ratio of Al and Ga. For example, as the composition ratio of Al increases, the wavelength becomes shorter.

The first electrode 134 is disposed on the lower surface of the first semiconductor layer 131, and the second electrode 135 is disposed on the upper surface of the second semiconductor layer 133. The first electrode 134 is an electrode bonded to the second assembly wiring 122 exposed in the opening hole 118*a*, and the second electrode 135 is an electrode that connects electrically a pixel electrode PE which will be described later and the second semiconductor layer 133. The first electrode 134 and the second electrode 135 can be formed of a conductive material.

The first electrode 134 can be disposed in the plurality of opening holes 118*a* to overlap the plurality of first assembly wirings 121 and the plurality of second assembly wirings 122. At this time, in order to bond the first electrode 134 to the second assembly wiring 122, the first electrode 134 can be made of a eutectic metal. For example, the first electrode 134 is made of tin (Sn), indium (In), zinc (Zn), lead (Pb), nickel (Ni), gold (Au), platinum (Pt), and copper (Cu), but is not limited thereto.

And both the green light emitting device 140 and the blue light emitting device 150 can be formed with the same or similar structure as the red light emitting device 130. For example, the green light emitting device 140 includes a first electrode, a first semiconductor layer on the first electrode, a green light emitting layer on the first semiconductor layer, a second semiconductor layer on the green light emitting layer, and a second electrode on the second semiconductor layer. Also, the blue light emitting device can include a structure in which a first electrode, a first semiconductor layer, a blue light emitting layer, a second semiconductor layer, and a second electrode are sequentially stacked.

However, the green light emitting device 140 and the blue light emitting device 150 can be formed of a compound selected from the group consisting of GaN, AlGaN, InGaN, AlInGaN, GaP, AlN, GaAs, AlGaAs, InP, and mixtures thereof, but is not limited to thereto.

Meanwhile, although not shown in the drawing, an insulating layer surrounding a portion of each of the plurality of light emitting devices LEDs can be disposed. Specifically, the insulating layer may cover at least a side surface of the plurality of light emitting devices LEDs among the outer surfaces of the light emitting devices LEDs. An insulating layer is formed on the light emitting device LED to protect the light emitting device LED, so electrical short circuit can be prevented when forming the first electrode 134 and the second electrode 135, the first semiconductor layer 131 and the second semiconductor layer 133.

Next, the second planarization layer 119 can be disposed on the plurality of light emitting devices LEDs. The second planarization layer 119 can be arranged to surround the top and side surfaces of the first planarization layer 118 and cover a portion of the top surfaces of the plurality of light emitting devices LEDs. The second planarization layer 119 has a plurality of light emitting devices.

Next, the second planarization layer 119 can be disposed on the plurality of light emitting devices LEDs. The second planarization layer 119 can be arranged to surround the top and side surfaces of the first planarization layer 118 and cover a portion of the top surfaces of the plurality of light emitting devices LEDs. The second planarization layer 119 can planarize the upper part of the substrate 110 on which the plurality of light emitting devices LEDs are disposed, and the plurality of light emitting devices LEDs formed at the opening hole 118*a* by the second planarization layer 119 can be stably fixed. The second planarization layer 119 can be composed of a single layer or a double layer, and can be made of, for example, an acryl-based organic material, but is not limited thereto.

The pixel electrode PE can be disposed on the second planarization layer 119. The pixel electrode PE is an electrode for electrically connecting a plurality of light emitting devices LED and the connection electrode CE. The pixel electrode PE can be electrically connected to the light emitting device LED of the opening hole 118*a* and the transparent electrode TE of the contact hole 118*b* through a contact hole formed in the second planarization layer 119. Accordingly, the second electrode 135, the transparent electrode TE, the connection electrode CE, and the second transistor TR2 of the light emitting device LED can be electrically connected through the pixel electrode PE.

The third layer VDD3 of the high potential power line VDD can be disposed on the second planarization layer 119. The third layer VDD3 may electrically connect the first layer VDD1 and the second layer VDD2 arranged in different rows. For example, the third layer VDD3 extends in the row direction between the plurality of sub-pixels SP, and connects the plurality of second layers VDD2 of the high potential power supply line VDD extending in the column direction to each other electrically connect with. In addition, as the plurality of high-potential power wiring lines VDD are connected in a mesh form through the third layer VDD3, the voltage drop phenomenon can be reduced.

The protective layer PTL can be disposed on the pixel electrode PE and the second planarization layer 119. The protective layer PTL is a layer to protect the structure below the protective layer PTL and can be composed of a single layer or multiple layers of translucent epoxy, silicon oxide (SiOx), or silicon nitride (SiNx), but is not limited thereto.

Meanwhile, in the opening hole 118*a*, the plurality of first assembly wirings 121 are spaced apart from the plurality of light emitting devices LEDs, and only the plurality of second assembly wirings 122 can contact the plurality of light emitting devices LEDs. This is to prevent defects that occur when a plurality of light emitting devices LEDs come into contact with both the first assembly wiring 121 and the plurality of second assembly wiring 122 during the manufacturing process of the display device 100. A third passivation layer 116 can be formed on the first assembly wiring 121, and a plurality of light emitting devices LEDs can be contacted only to the plurality of second assembly wirings 122. Hereinafter, a method of manufacturing the display device 100 according to an embodiment will be described in detail with reference to FIGS. 4A to 4F.

FIGS. 4A to 4F are process drawings for explaining a manufacturing method of a display device according to an embodiment. FIGS. 4A and 4B are process drawings for explaining a process of self-assembling a plurality of light emitting devices LEDs into the opening hole 118*a*. FIG. 4C is a schematic plan view of the mother substrate 10 used for self-assembly of a plurality of light emitting devices LEDs. FIG. 4D is a drawing schematically showing the electrical connection relationship between the plurality of assembly wires 120 and the assembly pad PD. FIG. 4E is a schematic plan view of a plurality of substrates 110 formed by scribing the mother substrate 10 after self-assembly of a plurality of light emitting devices LEDs is completed. FIG. 4F is a schematic cross-sectional view of area X in FIG. 4E.

Referring to FIG. 4A, a light emitting device LED is introduced into the chamber CB filled with the fluid WT. The fluid WT can include water, etc., and the chamber CB filled with the fluid WT may have an open top.

Next, the mother substrate 10 can be placed on the chamber CB filled with light emitting devices LED. The mother substrate 10 is a substrate composed of a plurality of substrates 110 forming the display device 100, and when self-assembling a plurality of light emitting devices LEDs, a plurality of assembly wirings 120 and a first light absorption layer 160 are formed and the mother substrate 10 formed up to the first planarization layer 118 can be used.

And the mother substrate 10 formed with the first assembly wiring 121, the second assembly wiring 122, the first light absorption layer 160, and the first planarization layer 118 is placed on the chamber CB, and put into the chamber CB. At this time, the mother substrate 10 can be positioned so that the opening hole 118*a* and the fluid WT face each other.

Next, the magnet MG can be placed on the mother substrate 10. Light emitting devices LEDs that sink or float on the bottom of the chamber CB may move toward the mother substrate 10 by the magnetic force of the magnet MG.

At this time, the light emitting device LED can include a magnetic material to move by a magnetic field. For example, the first electrode 134 or the second electrode 135 of the light emitting device LED can include a ferromagnetic material such as iron, cobalt, or nickel.

Next, the light emitting device LED moved toward the first light absorption layer 160 and the first planarization layer 118 by the magnet MG is connected to the first assembly wiring 121 and the second assembly wiring 122. So, the light emitting device LED can be self-assembled in the opening hole 118*a* by the formed electric field.

An alternating voltage can be applied to the plurality of first assembly wirings 121 and the plurality of second assembly wirings 122 to generate an electric field. Due to this electric field, the light emitting device LED is dielectrically polarized and may have polarity. And a dielectric polarized light emitting device LED can be moved or fixed in a specific direction by dielectrophoresis DEP, that is, an electric field. Therefore, a plurality of light emitting devices LEDs can be fixed within the opening hole 118*a* using dielectrophoresis.

Next, the mother substrate 10 is flipped 180° with the light emitting device LED fixed in the opening hole 118*a* using the electric fields of the plurality of first assembly wirings 121 and the plurality of second assembly wirings 122. In the embodiment, the mother substrate 10 can be turned over while voltage is applied to the plurality of first assembly wirings 121 and the plurality of second assembly wirings 122 and a subsequent process can be performed.

And with the first electrode 134 of the light emitting device LED located on the second assembly wiring 122, heat and pressure are applied to the light emitting device LED to connect the light emitting device LED to the second assembly wiring 122. For example, the first electrode 134 of the light emitting device LED can be bonded to the second assembly wiring 122 through eutectic bonding. Eutectic bonding is a bonding method using heat compression at high temperatures and is one of the bonding processes that is very strong and highly reliable. The eutectic bonding method not only realizes high bonding strength, but also has the advantage of eliminating the need to apply a separate adhesive from the outside. However, the bonding method of the plurality of light emitting devices LEDs can be by various ways other than eutectic bonding, but is not limited thereto.

Meanwhile, different voltages are applied to the plurality of first assembly wirings 121 and the plurality of second assembly wirings 122 when manufacturing the display device 100, but the same voltage can be applied when driving the display device 100. To this end, when manufacturing the display device 100, the plurality of first assembly wirings 121 and the plurality of second assembly wirings 122 can be connected to different assembly pads PD and different voltages can be applied.

In this regard, referring to FIG. 4C, when manufacturing the display device 100, in the state of the mother substrate 10, the assembly wiring 120 on the plurality of substrates 110 is connected to the assembly pad PD outside the plurality of substrates 110. Specifically, a plurality of substrates 110 forming the display device 100, a plurality of assembly pads PD, and a plurality of assembly wiring connection parts PL are disposed on the mother substrate 10.

The plurality of assembly pads PD are pads for applying voltage to the plurality of assembly wirings 120, and are electrically connected to the plurality of assembly wirings 120 disposed on each of the plurality of substrates 110 forming the mother substrate 10. A plurality of assembly pads PD can be formed on the mother substrate 10 outside the substrate 110 of the display device 100, and when the manufacturing process of the display device 100 is completed, the substrate PD of the display device 100 can be separated from the substrates 110. For example, when two substrates 110 are formed on the mother substrate 10, the plurality of first assembly wirings 121 disposed on each substrate 110 are connected to one assembly pad PD. And, the plurality of second assembly wires 122 can be connected to other assembly pads PD.

Therefore, after placing the mother substrate 10 in the chamber CB into which a plurality of light emitting devices LEDs are inserted, an alternating voltage is applied to the plurality of assembly wirings 120 through the plurality of assembly pads PD to create an electric field. So, a plurality of light emitting devices LEDs can be easily self-assembled into the opening hole 118*a*.

Meanwhile, when self-assembling a plurality of light emitting devices LEDs for each of a plurality of sub-pixels SP, a plurality of assembly lines 120 arranged in a plurality of red sub-pixels SPR, a plurality of assembly wires 120 arranged in a plurality of green sub-pixels SPG and the plurality of assembly wires 120 arranged in the plurality of blue sub-pixels SPB can be connected to different assembly pads PD.

In this case, the plurality of assembly pads PD include the first assembly pad PD1, the second assembly pad PD2, the third assembly pad PD3, the fourth assembly pad PD4, and the fifth assembly pad PD5. and a sixth assembly pad PD6.

The first assembly pad PD1 is a pad for applying voltage to the plurality of first assembly wirings 121 disposed in the plurality of red sub-pixels SPR on the mother substrate 10. The fourth assembly pad PD4 is a pad for applying voltage to the plurality of second assembly wirings 122 disposed in the plurality of red sub-pixels SPR on the mother substrate 10.

The second assembly pad PD2 is a pad for applying voltage to the plurality of first assembly wirings 121 disposed in the plurality of green sub-pixels SPG on the mother substrate 10. The fifth assembly pad PD5 is a pad for applying voltage to the plurality of second assembly wirings 122 disposed in the plurality of green sub-pixels SPG on the mother substrate 10.

The third assembly pad PD3 is a pad for applying voltage to the plurality of first assembly wirings 121 disposed in the plurality of blue sub-pixels SPB on the mother substrate 10. The sixth assembly pad PD6 is a pad for applying voltage to the plurality of second assembly wirings 122 disposed in the plurality of blue sub-pixels SPB on the mother substrate 10.

Through these plurality of assembly pads PD, the light emitting device LED can be selectively self-assembled only in a specific subpixel SP among the plurality of subpixels SP. For example, when self-assembling the light emitting device LED only to a plurality of red sub-pixels SPR, the light emitting device LED is self-assembled to the plurality of red sub-pixels SPR through the first assembly pad PD1 and the fourth assembly pad PD4. Voltage can be applied only to the plurality of first assembly wirings 121 and the plurality of second assembly wirings 122 arranged.

The assembly wiring connecting portion PL is a wiring connecting the plurality of assembly wirings 120 and the plurality of assembly pads PD on each substrate 110. The assembly wiring connection portion PL has one end connected to a plurality of assembly pads PD and the other end extending onto the plurality of substrates 110 to be electrically connected to a plurality of first assembly wiring lines 121 and a plurality of second assembly wiring lines 122. The assembly wiring connection part PL includes a first connection part PL1, a second connection part PL2, a third connection part PL3, a fourth connection part PL4, a fifth connection part PL5, and a sixth connection part PL6.

The first connection portion PL1 is a wiring that electrically connects the first assembly wiring 121 disposed in the plurality of red sub-pixels SPR on the mother substrate 10 and the first assembly pad PD1. The fourth connection part PL4 is a wire that electrically connects the second assembly wire 122 and the fourth assembly pad PD4 disposed in the plurality of red sub-pixels SPR on the mother substrate 10. For example, the other end of the first connection part PL1 extends to each of the plurality of substrates 110, and can be electrically connected to a plurality of first assembly lines 121 disposed on the red sub-pixels SPR of each of the plurality of substrates 110. For example, the other end of the fourth connection portion PL4 extends to each of the plurality of substrates 110, and can be electrically connected to a plurality of second assembly lines 122 are disposed on the red sub-pixels SPR of each of the plurality of substrates 110.

The second connection portion PL2 is a wiring that electrically connects the first assembly wiring 121 and the second assembly pad PD2 disposed in the plurality of green sub-pixels SPG on the mother substrate 10. The fifth connection portion PL5 is a wiring that electrically connects the second assembly wiring 122 and the fifth assembly pad PD5 disposed in the plurality of green sub-pixels SPG on the mother substrate 10.

The third connection part PL3 is a wire that electrically connects the first assembly wire 121 and the third assembly pad PD3 disposed in the plurality of blue sub-pixels SPB on the mother substrate 10. The sixth connection portion PL6 is a wiring that electrically connects the second assembly wiring 122 and the sixth assembly pad PD6 disposed in the plurality of blue sub-pixels SPB on the mother substrate 10.

At this time, the plurality of first assembly wirings 121 disposed on one substrate 110 are connected into one, and the plurality of second assembly wirings 122 are also connected into one to form a plurality of first assembly wirings 121 and a plurality of plurality of assembly wirings 121. Each of the second assembly wires 122 can be easily connected to the assembly wire connection portion PL.

For example, referring to FIG. 4D, the first assembly wiring 121 disposed in a plurality of red sub-pixels SPR on one substrate 110 is a link wiring in the non-display area NA of the substrate 110. The second assembly wiring 122, which is connected as one through LL and arranged in a plurality of red sub-pixels SPR, may also be connected as one through a link wiring LL in the non-display area NA of the substrate 110. In this case, each of the plurality of first assembly wirings 121 and the plurality of second assembly wirings 122 disposed on one substrate 110 are not individually connected to the assembly wiring connecting portion PL But, in the non-display area NA, a link wire LL connecting each of the plurality of first assembly wirings 121 and a plurality of second assembly wirings 122 into an assembly wiring connection portion PL connected to a plurality of first assembly wirings 121 and the plurality of second assembly wires 122, therefore a voltage for self-assembly of the light emitting device LED can be easily applied.

Meanwhile, the assembly wiring connection portion PL can be formed of the same material and the same process as the plurality of assembly wiring 120, or can be formed of different materials and processes. Additionally, the assembly wiring connection part PL may have a single-layer structure or a multi-layer structure, but is not limited thereto.

In addition, the assembly wiring connection portion PL and assembly pad PD shown in FIGS. 4C and 4D are exemplary, and the arrangement and shape of the assembly wiring connection portion PL and assembly pad PD, and the number or sequence of the self-assembly process may vary depending on the design of the plurality of sub-pixels SP.

Next, referring to FIGS. 4E and 4F, after the self-assembly process of the plurality of light emitting devices LEDs is completed, the mother substrate 10 can be cut and separated along the scribing line SCL to form the plurality of substrates 110. In addition, when scribing the mother substrate 10, a portion of the assembly wiring connecting portion PL connecting the plurality of assembly wirings 120 and the plurality of assembly pads PD at the edge of the substrate 110 can be cut. Accordingly, the cut surface of the assembly wiring connection portion PL can be seen on the cut surface of the substrate 110.

For example, in area X in FIG. 4E, a cross section of the substrate 110, a cross section of a plurality of insulating layers IL disposed to form a driving circuit or a plurality of wirings on the substrate 110, and an assembled wiring connection portion disposed between the plurality of insulating layers IL can be seen. A first connection portion PL1 connecting the first assembly wiring 121 of the plurality of red sub-pixels SPR between the plurality of insulating layers IL, and the first assembly wiring 121 of the plurality of green sub-pixels SPG and the third connection part PL3 connecting the first assembly lines 121 of the plurality of blue sub-pixels SPB can be seen.

Next, after the mother substrate 10 is scribed and separated into a plurality of substrates 110, the plurality of first assembly wirings 121 are connected to one by a link wiring LL, and the plurality of second assembly wirings 122 are connected to each other by a link wire LL. So, the same voltage can be easily applied to the plurality of first assembly wires 121 and the plurality of second assembly wires 122 using the link wires.

Next, after the mother substrate 10 is scribed and separated into a plurality of substrates 110, the plurality of first assembly wirings 121 are connected to one by a link wiring LL, and the plurality of second assembly wirings 121 are connected to each other. The wires 122 are connected together by a link wire LL, and the same voltage can be easily applied to the plurality of first assembly wires 121 and the plurality of second assembly wires 122 using the link wires. For example, when driving the display device 100, in the non-visible area NA, the link wire LL connecting each of the plurality of first assembly wires 121 and the plurality of second assembly wires 122 into one can be connected to the driving IC, voltage can be applied to the plurality of first assembly wirings 121 and the plurality of second assembly wirings 122.

In the display device 100 according to the embodiment, at least a portion of the plurality of assembly wirings 120 for self-assembly of the plurality of light emitting devices LEDs are used as wiring for applying a low-potential power supply voltage to the plurality of light emitting devices LEDs. When manufacturing the display device 100, a plurality of light emitting devices LEDs floating in the fluid WT can be moved adjacent to the mother substrate 10 using a magnetic field. Subsequently, different voltages can be applied to the plurality of first assembly wirings 121 and the plurality of second assembly wirings 122 to form an electric field, and the plurality of light emitting devices LEDs can be formed through a plurality of openings 118*a* can be self-assembled. At this time, instead of separately forming a wiring supplying a low-potential voltage and connecting it to a plurality of self-assembled light emitting devices LEDs, a light emitting device LED is connected to the second assembly wiring 122, a portion of which is exposed within the opening hole 118*a*. By bonding the first electrode 134 of the LED, the plurality of assembly wirings 120 can be used as wiring for supplying low-potential voltage to the plurality of light emitting devices LEDs when the display device 100 is driven.

Therefore, in the display device 100 according to the embodiment, the plurality of assembly wirings 120 can be used not only as self-assembly of the plurality of light emitting devices LED, but also as wiring for driving the plurality of light emitting devices LED.

In the display device 100 according to the embodiment, the first light absorption layer 160 is disposed between the plurality of assembly wirings 120 and the first planarization layer 118, and the first light absorption layer 160 is connected to the plurality of light emitting devices. By arranging the LEDs to surround the area where the LEDs are placed, there is a technical effect of improving the brightness of the display device 100.

First, in the existing display device, the light absorption layer is formed on the planarization layer and the pixel electrode, so that the light absorption layer is disposed on top of the plurality of light emitting devices. Accordingly, the light emitted from the side of the plurality of light emitting devices and the light emitted diagonally upward are absorbed by the light absorbing layer, a significant portion of the light emitted from the light emitting devices is absorbed by the light absorbing layer, so there was a problem of decrease in luminance, especially for the side surface luminance.

Accordingly, in the display device 100 according to the embodiment, the first light absorption layer 160 may be disposed between the plurality of assembly wirings 120 and the first planarization layer 118. Accordingly, the degree to which light emitted from the light emitting device (LED) is absorbed by the first light absorption layer 160 can be minimized, there are technical effects of improving the brightness, especially the lateral brightness, of the display device 100 and improving the viewing angle.

In particular, in the display device 100 according to the embodiment, the top surface of the first light absorption layer 160 is located lower than the top surface of the plurality of light emitting devices LEDs, thereby there is a technical effect that the brightness, especially the side brightness, of the display device 100 can be improved and the viewing angle can be further improved.

Additionally, in the display device 100 according to the embodiment, the first light absorption layer 160 is disposed on the plurality of assembly wirings 120 and is arranged to surround the plurality of light emitting devices LEDs to function as a planarization layer.

Therefore, since a separate process for forming the first light absorption layer 160 is not required, there is a technical effect of reducing process costs. Specifically, the first light absorption layer 160 has the technical effect of functioning as a planarization layer and at the same time as a light absorption layer that reduces external light reflection. Accordingly, since a separate first light absorption layer 160 may not be formed on the planarization layer, the number of processes can be reduced.

Therefore, in the display device 100 according to the embodiment, the first light absorption layer 160 is disposed on the plurality of assembly wirings 120 and is arranged to surround the plurality of light emitting devices LEDs to function as a planarization layer. Therefore, the manufacturing process of the display device 100 can be simplified and there is a complex technical effect of reducing process costs.

In addition, in the display device 100 according to the embodiment, the transparent electrode TE is disposed on the connection electrode CE, and the pixel electrode PE is connected to the transparent electrode TE through the contact hole 118*b*, so external light reflection in the hole 118*b* can be reduced. Since the first light absorption layer 160 is not disposed in the area where the contact hole 118*b* is formed, external light reflection may occur when a metal material is disposed in the contact hole 118*b*.

Accordingly, in the display device 100 according to the embodiment, the transparent electrode TE may be disposed on the connection electrode CE. An extended portion of the transparent electrode TE extending outside the connection electrode CE may be exposed by the contact hole 118*b* and connected to the pixel electrode PE. Therefore, in the display device 100 according to the embodiment, regardless of the arrangement position of the first light absorption layer 160, there are technical effects that the external light reflection shape in the contact hole 118*b* can be reduced, and the visibility of the display device 100 can be improved.

In addition, in the display device 100 according to the embodiment, light emitted from the light emitting device LED through the first light absorption layer 160 is transmitted to the first active layer ACT1 of the first transistor TR1, it is possible to block incident light on the second active layer ACT2 of the second transistor TR2 and the third active layer ACT3 of the third transistor TR3.

If the first active layer ACT1, the second active layer ACT2, and the third active layer ACT3 are made of an oxide semiconductor, the first active layer ACT1, the second active layer ACT2, and the third active layer ACT3 can be deteriorated by light incident on the first active layer ACT1, the second active layer ACT2, and the third active layer ACT3.

Accordingly, in the display device 100 according to the embodiment, the first light absorption layer 160 is arranged to surround the area where the light emitting device LED is disposed, so that the light emitted from the light emitting device LED transmitted to the first active layer ACT1, the second active layer ACT2, and the third active layer ACT3 can be blocked, and there is a complex technical effect that can improve the stability of the transistors TR1, TR2, TR3.

FIG. 5 is a cross-sectional view of a display device according to a second embodiment. Compared to the display device 100 of FIGS. 1 to 3, there is difference in that the display device 500 of FIG. 5 has a second light absorption layer 570 further disposed, and no transparent electrode TE is disposed in the contact hole 518*b*. Other features are substantially the same, so redundant description will be omitted.

Referring to FIG. 5, the second light absorption layer 570 can be further disposed on the pixel electrode PE. The second light absorption layer 570 can be disposed between the plurality of sub-pixels SP on the pixel electrode PE. The second light absorption layer 570 is arranged to reduce color mixing between the plurality of sub-pixels SP and minimize external light reflection, and can be arranged to absorb light emitted from the light emitting device LED.

Additionally, the second light absorption layer 570 is disposed to overlap the contact hole below the connection electrode CE to minimize reflection of external light caused by the contact hole below the connection electrode CE. The second light absorption layer 570 can be made of an opaque material like the first light absorption layer 160, for example, black resin, but is not limited thereto.

Referring to FIG. 5, the contact hole 518*b* of the first planarization layer 518 can be disposed to expose the top surface of the connection electrode CE. Specifically, the contact hole 518*b* of the first planarization layer 518 overlaps the contact hole of the third passivation layer 116, the first light absorption layer 160, and the second planarization layer 119, and exposes the upper surface of the connection electrode CE. Accordingly, the contact hole 518*b* can be arranged to overlap the contact hole below the connection electrode CE, and the pixel electrode PE disposed in the contact hole 518*b* can be electrically connected to the connection electrode CE.

In the display device 500 according to the second embodiment, the second light absorption layer 570 is further disposed on the pixel electrode PE, so that the contact hole 518*b* and the contact hole below the connection electrode CE overlap. Even so, there is a technical effect that can minimize the external light reflection phenomenon caused by the contact hole at the bottom of the connection electrode CE.

First, as described above, if the contact hole 518*b* and the contact hole below the connection electrode CE are arranged to overlap, and the upper surface of the connection electrode CE is exposed by the contact hole 518*b*, there can be a problem that the visibility of the display device 100 is reduced due to external light reflection by the contact hole at the bottom of the connection electrode CE.

Accordingly, in the second embodiment, the second light absorption layer 570 is further disposed on the upper part of the area where the contact hole 518*b* and the contact hole below the connection electrode CE overlap, thereby forming a contact hole below the connection electrode CE. Even if the contact hole 518*b* overlaps, the external light reflected from the metal wiring under the connection electrode CE can be absorbed into the second light absorption layer 570 by the contact hole 518*b* and the contact hole below the connection electrode CE.

Accordingly, there is a technical effect of reducing the external light reflection phenomenon caused by the overlap between the contact hole at the bottom of the connection electrode CE and the contact hole 518*b*. Therefore, in the display device 500 according to the second embodiment, as the second light absorption layer 570 is further disposed on the pixel electrode PE, even if the contact hole 518*b* and the contact hole below the connection electrode CE overlap, it is possible to minimize external light reflection caused by the contact hole below the connection electrode CE and has the technical effect of improving the visibility of the display device 500.

Figure 6:
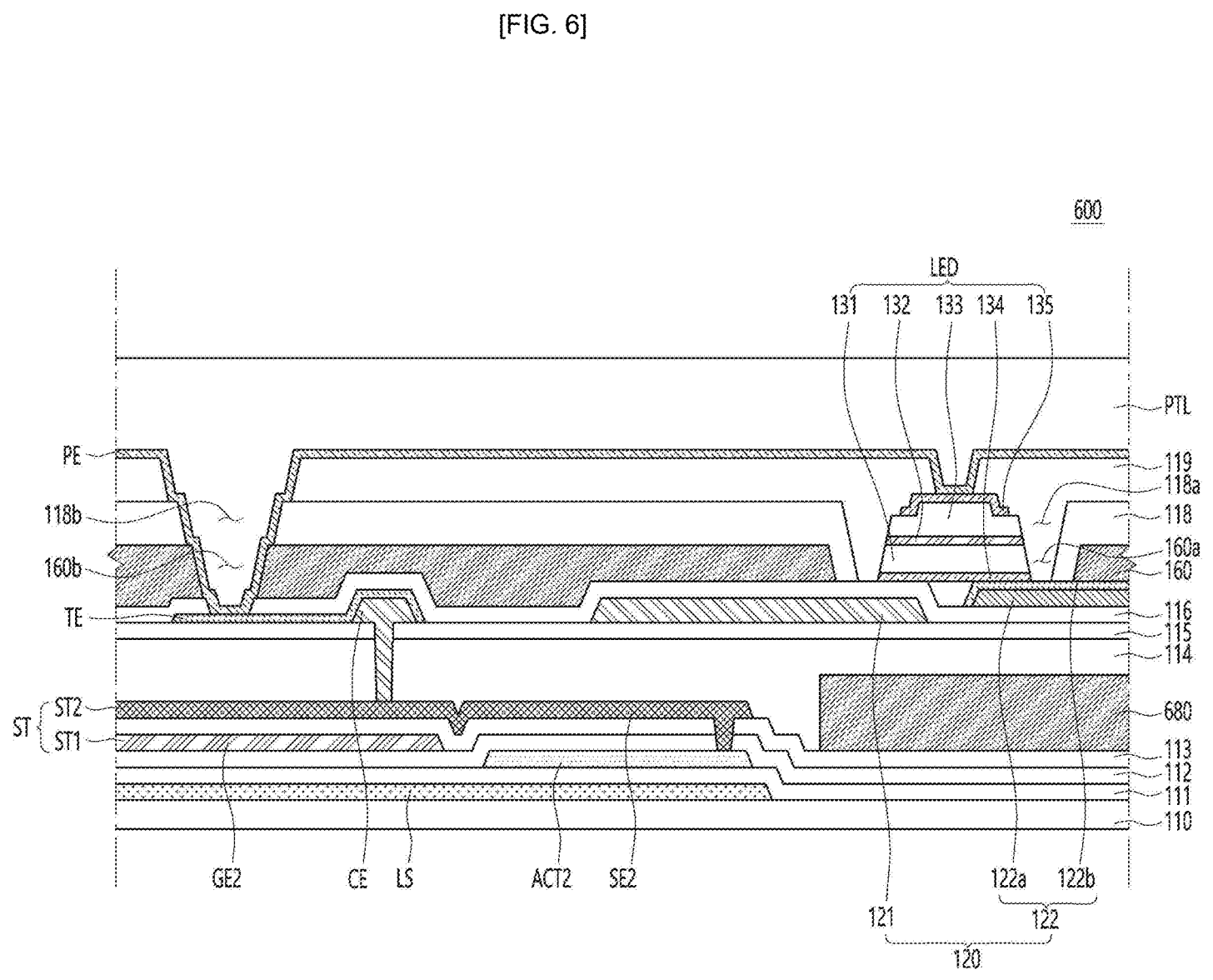

FIG. 6 is a cross-sectional view of a display device according to a third embodiment. The display device 600 of FIG. 6 differs from the display device 100 of FIGS. 1 to 3 only in that the third light absorption layer 680 is further disposed, but other features are substantially the same, so duplicate descriptions will be omitted.

Referring to FIG. 6, a third light absorption layer 680 can be further disposed on the lower planarization layer 114. The third light absorption layer 680 can be disposed below the first assembly wiring 121 and the second assembly wiring 122 to overlap the opening hole 118*a*. That is, the third light absorption layer 680 can be disposed in the lower area where the light emitting device LED is disposed.

The third light absorption layer 680 may have light absorption characteristics to absorb light emitted from the light emitting device LED. The third light absorption layer 680 can be made of an opaque material, for example, black resin, but is not limited thereto.

In the display device 600 according to the third embodiment, the third light absorption layer 680 is disposed on the lower planarization layer 114 overlapping the lower area where the light emitting device LED is disposed, and there is a technical effect that can minimize deterioration of the active layers ACT1, ACT2, ACT3 by light emitted from a light emitting device LED.

The third light absorption layer 680 can block light emitted from the light emitting device LED to enter the active layers ACT1, ACT2, and ACT3 of the transistors TR1, TR2, and TR3 disposed below the lower planarization layer.

If the active layers ACT1, ACT2, and ACT3 are made of an oxide semiconductor, the active layers ACT1, ACT2, and ACT3 can be deteriorated by light incident on the active layers ACT1, ACT2, and ACT3. Accordingly, the third light absorption layer 680 is disposed in the lower area where the light emitting device LED is disposed, to prevent light emitted from the light emitting device LED from entering the active layers ACT1, ACT2, and ACT3.

Therefore, in the display device 600 according to the third embodiment, the third light absorption layer 680 is disposed on the lower planarization layer 114 overlapping the lower area where the light emitting device LED is disposed, and there is a complex technical effect that can minimize deterioration of the active layers ACT1, ACT2, ACT3 by light emitted from the light emitting device LED and improve the stability of transistors TR1, TR2, TR3.

FIG. 7 is a cross-sectional view of a display device according to a fourth embodiment. The display device 700 of FIG. 7 differs from the display device 100 of FIGS. 1 to 3 only in that the third light absorption layer 780 is further disposed, and other features are substantially the same, so duplicate descriptions can be omitted.

Referring to FIG. 7, a third light absorption layer 780 can be disposed on the transistors TR1, TR2, and TR3. The third light absorption layer 780 is disposed to surround the transistors TR1, TR2, and TR3 and can planarize the area where the transistors TR1, TR2, and TR3 are disposed. Accordingly, the third light absorption layer 780 may function as a lower planarization layer.

At this time, there are technical effects in that the third light absorption layer 780 is disposed on at least the entire display area AA to reduce external light reflection and at the same time prevent light emitted from the light emitting device LED from entering the active layers ACT1, ACT2, and ACT3 can be minimized.

The third light absorption layer 780 may have light absorption characteristics to absorb light emitted from the light emitting device LED and external light. The third light absorption layer 780 can be made of an opaque material, for example, black resin, but is not limited thereto.

In the display device 700 according to the fourth embodiment, the third light absorption layer 780 is disposed to flatten the upper portions of the plurality of transistors TR1, TR2, and TR3 at least in the entire display area AA, and the active layers ACT1, ACT2, ACT3 have the technical effect of minimizing deterioration by light emitted from a light emitting device LED.

The third light absorption layer 780 has a technical effect of blocking light emitted from the light emitting device LED from entering the active layers ACT1, ACT2, and ACT3 of the transistors TR1, TR2, and TR3. If the active layers ACT1, ACT2, and ACT3 are made of an oxide semiconductor, the active layers ACT1, ACT2, and ACT3 can be deteriorated by light incident on the active layers ACT1, ACT2, and ACT3.

Accordingly, the third light absorption layer 780 is disposed in the lower area where the light emitting device LED is disposed, and the third light absorption layer 780 can block light emitted from the light emitting device LED from entering the active layers ACT1, ACT2, and ACT3.

Accordingly, in the display device 700 according to the fourth embodiment, the third light absorption layer 780 is disposed to flatten the upper portions of the plurality of transistors TR1, TR2, and TR3 at least in the entire display area AA. And there is a complex technical effect of minimizing deterioration of the active layers ACT1, ACT2, and ACT3 by light emitted from the light emitting device and improve the stability of the transistors TR1, TR2, TR3.

Additionally, in the display device 700 according to the fourth embodiment, the third light absorption layer 780 may function as a planarization layer. Therefore, since a separate process for forming the third light absorption layer 780 is not required, process costs can be reduced. Specifically, the third light absorption layer 780 may function as a planarization layer and at the same time as a light absorption layer to reduce external light reflection phenomenon. Accordingly, since the third light absorption layer 780 separate from the planarization layer may not be formed, the number of processes can be reduced.

Therefore, in the display device 700 according to the fourth embodiment, the third light absorption layer 780 is disposed on the plurality of transistors TR1, TR2, and TR3 and can function as a planarization layer, so the manufacturing process of the display device 700 can be simplified and there is a technical effect of reducing process costs.

FIG. 8 is a cross-sectional view of a display device according to a fifth embodiment. The display device 800 of FIG. 8 has a different reflector RP, first planarization layer 817, second light absorption layer 870, and a plurality of assembly wirings 820 compared to the display device 500 of FIG. 5. However, other features are substantially the same, so redundant description will be omitted.

Referring to FIG. 8, each of the plurality of first assembly wirings 821 includes a first conductive layer 821*a* and a first clad layer 821*b*. The first clad layer 821*b* can be disposed on the second passivation layer 115. The first conductive layer 821*a* can be electrically connected to the first clad layer 821*b*. For example, the first clad layer 821*b* can be disposed to cover the top and side surfaces of the first conductive layer 821*a*. And the first conductive layer 821*a* may have a thickness greater than that of the first clad layer 821*b*.

The first clad layer 821*b* is made of a material that is more resistant to corrosion than the first conductive layer 821*a*, and when manufacturing the display device 800, short circuit defects due to migration between the first conductive layer 821*a* of the first assembly wiring 821 and the second conductive layers 822*a* of the second assembly wiring 822 can be minimized. For example, the first clad layer 821*b* can be made of molybdenum (Mo), molybdenum titanium (MoTi), etc., but is not limited thereto.

Next, the first jumping wire JL1 can be arranged on the second passivation layer 115 to be spaced apart from the first clad layer 821*b*. The first jumping wire JL1 is disposed on a different layer from the second assembly wiring 822 and can be electrically connected to the second assembly wiring 822 through a contact hole connection. The first jumping wire JL1 can be disposed on the same layer as the first clad layer 821*b*. For example, the first jumping wire JL1 can be made of molybdenum (Mo), molybdenum titanium (MoTi), etc., but is not limited thereto.

The third passivation layer 116 can be disposed on the first assembly wiring 821 and the first jumping wiring JL1. The third passivation layer 116 is an insulating layer to protect the structure below the third passivation layer 116, and can be composed of a single layer or multiple layers of silicon oxide $SiO_x$ or silicon nitride SiNx, but is limited thereto.

Each of the plurality of second assembly wirings 822 includes a second conductive layer 822*a* and a second clad layer 822*b*. The second conductive layer 822*a* can be disposed on the third passivation layer 116. Additionally, the second clad layer 822*b* can be electrically connected to the second conductive layer 822*a*. For example, the second clad layer 822*b* can be disposed to cover the top and side surfaces of the second conductive layer 822*a*. And the second conductive layer 822*a* may have a thickness greater than that of the second clad layer 822*b*.

Referring to FIG. 8, the second clad layer 822*b* extends from the top surface of the second conductive layer 822*a* to the top surface of the third passivation layer 116 along the side surface of the second conductive layer 822*a*. The second clad layer 882*b* extending to the upper surface of the third passivation layer 116 is arranged to overlap the first jumping wire JL1 and is electrically connected to the first jumping wire JL1 through a contact hole connection. Accordingly, the second assembly wiring 822 can be electrically connected to the first jumping wiring JL1.

The first planarization layer 817 can be disposed on the plurality of assembly lines 820. Specifically, the first planarization layer 817 can be disposed on the plurality of first assembly wirings 821, the plurality of second assembly wirings 822, the first jumping wiring JL1, and the connection electrode CE.

The first planarization layer 817 is arranged to surround the area where the light emitting device LED is placed, and can flatten the area where the light emitting device LED is placed. The first planarization layer 817 can be composed of a single layer or a double layer, and can be made of, for example, an acrylic-based organic material, but is not limited thereto.

The first planarization layer 817 includes an opening hole 817*a* and a contact hole 817*b*, and a light emitting device LED can be disposed within the opening hole 817*a* of the first planarization layer 817. The contact hole 817*b* of the first planarization layer 817 exposes the upper surface of the connection electrode CE. Accordingly, as the exposed portion of the pixel electrode PE and the connection electrode TE are connected, the light emitting device LED and the transistors TR1, TR2, and TR3 can be electrically connected.

The plurality of opening holes 817*a* are parts into which a plurality of light emitting devices LEDs are inserted, and may also be referred to as pockets. The plurality of opening holes 817*a* can be formed to overlap the plurality of assembly wirings 120.

The second jumping wire JL2 arranged to overlap the plurality of light emitting devices LED and the first jumping wire JL1 can be disposed on the plurality of opening holes. That is, the second jumping wire JL2 is arranged to correspond to the position where the light emitting device LED is seated, is made of a conductive material, and can be electrically connected to the light emitting device LED. The second jumping wire JL2 can be electrically connected to the first jumping wire JL1 through a contact hole connection.

Referring to FIG. 8, the first clad layer 821*b* and the second clad layer 822*b* are arranged to extend to the outer area of the first conductive layer 821*a* and the second conductive layer 822*a*, and the second clad layer 822*b* can be electrically connected to the first jumping wire JL1 and the second jumping wire JL2 arranged to overlap the light emitting device. In addition, the light emitting device LED is placed to overlap an extension of the first clad layer 821*b* extending to the outer region of the first conductive layer 821*a* and the second clad layer 822*b* extending to the outer region of the second conductive layer 822*a*.

In addition, the second clad layer 822*b*, which is arranged to overlap the light emitting device LED and extends from the upper surface of the second conductive layer 822*a* to the outside of the second conductive layer 822*a*, is connected to the light emitting device LED. The second clad layer 822*b* can be arranged to overlap with the first jumping wire JL1, which is arranged to overlap and be electrically connected. Accordingly, the light emitting device LED can be arranged so as not to overlap the first conductive layer 821*a* and the second conductive layer 822*a*.

A plurality of reflectors RP are disposed on the side of the first planarization layer 817 where the plurality of opening holes 817*a* are formed. A plurality of reflectors RP are arranged to surround a plurality of light emitting devices LEDs. The plurality of reflectors RP are configured to converge light emitted from the plurality of light emitting devices LEDs. The plurality of reflectors RP can include, for example, aluminum (Al), but is not limited thereto.

For example, the plurality of reflectors RP can be arranged so that the plurality of reflectors RP are spaced apart from each other and surround each light emitting device LED. Accordingly, the plurality of reflectors RP can be arranged so as to directly contact and not interfere with the plurality of assembly wires 820, and this can prevent short circuits of the plurality of assembly wires 820 from interfering between the reflectors RP and the plurality of assembly wires 820.

The second planarization layer 818 can be disposed on the first planarization layer 817 and the reflector RP. The second planarization layer 818 is disposed to surround the top surface of the first planarization layer 817 and the side surface where the reflector RP is disposed. Accordingly, the reflector RP can be disposed between the first planarization layer 817 and the second planarization layer 818 and be stably supported by the first planarization layer 817 and the second planarization layer 818. The second planarization layer 818 can be composed of a single layer or a double layer, and can be made of, for example, an acryl-based organic material, but is not limited thereto.

The second planarization layer 818 includes a plurality of opening holes 818*a* on which each of the plurality of light emitting devices LEDs is seated, and a plurality of contact holes 518*b* exposing each of the plurality of connection electrodes CE. At this time, the opening hole 818*a* of the second planarization layer 818 overlaps the opening hole 817*a* of the first planarization layer 817, and the contact hole 518*b* of the second planarization layer 818 is arranged to overlap the contact hole 817*b* of the first planarization layer 817.

In the display device 800 according to the fifth embodiment, a reflector RP is disposed to surround the light emitting device LED on the side of the first planarization layer 817 where the opening hole 817*a* is disposed, so that the concentrating efficiency of light emitted from the light emitting device can be improved. Specifically, the reflector RP can be disposed to be inclined so that light emitted from the light emitting device LED is reflected toward the outside of the display device 800.

Accordingly, among the light emitted from the light emitting device LED, especially the light emitted in the side and bottom directions of the light emitting device LED, the light path can be changed to the outside of the display device 800 by being reflected by the reflector RP. Among the lights emitted from the light emitting device LED, especially the lights that might be lost in the side and bottom directions of the light emitting device LED, can be extracted to the outside of the display device 800.

Accordingly, in the display device 800 according to the fifth embodiment, the reflector RP is disposed to surround the light emitting device LED on the side of the first planarization layer 817 where the opening hole 817*a* is disposed, so there is a complex technical effect in which the concentrating efficiency of light emitted from an LED can be improved and the luminance of the display device 800 can be improved.

FIG. 9 is a cross-sectional view of a display device according to a sixth embodiment. The display device 900 of FIG. 9 differs from the display device 800 of FIG. 8 only in the plurality of reflectors RP and the plurality of assembly wirings 920, but other features are substantially the same, so duplicate descriptions are omitted.

The plurality of first assembly wirings 921 include a first conductive layer 921*a* and a first clad layer 921*b*. The first conductive layer 921*a* can be disposed on the second passivation layer 115. The first clad layer 921*b* can be in contact with the first conductive layer 921*a*. For example, the first clad layer 921*b* can be disposed to cover the top and side surfaces of the first conductive layer 921*a*. And the first conductive layer 921*a* may have a thickness greater than that of the first clad layer 921*b*.

Subsequently, the third passivation layer 116 can be disposed on the first assembly wiring 921. The third passivation layer 116 is an insulating layer to protect the structure below the third passivation layer 116, and can be composed of a single layer or multiple layers of silicon oxide SiOx or silicon nitride SiNx, but is limited thereto.

Among the plurality of assembly wiring lines 920, a plurality of second assembly wiring lines 922 can be disposed on the third passivation layer 116. The plurality of first assembly wires 921 and the plurality of second assembly wires 922 can be arranged to be spaced apart from each other.

Each of the plurality of second assembly wirings 922 includes a second conductive layer 922*a* and a second clad layer 922*b*. The second conductive layer 922*a* can be disposed on the third passivation layer 116. Additionally, the second clad layer 922*b* can be electrically connected to the second conductive layer 922*a*. For example, the second clad layer 922*b* can be disposed to cover the top and side surfaces of the second conductive layer 922*a*. And the second conductive layer 922*a* may have a thickness greater than that of the second clad layer 922*b*.

The second clad layer 922*b* is made of a material that is more resistant to corrosion than the second conductive layer 922*a*, so short circuit defects due to migration between the first assembly wiring 921 and the second assembly wiring 922 when manufacturing the display device 900 can be minimized. For example, the second clad layer 922*b* can be made of molybdenum (Mo), molybdenum titanium (MoTi), etc., but is not limited thereto.

Next, the first planarization layer 917 can be disposed on the plurality of second assembly wirings 922. The first planarization layer 917 can be composed of a single layer or a double layer, and can be made of, for example, an acryl-based organic material, but is not limited thereto.

Meanwhile, the first planarization layer 917 includes a plurality of opening holes 917*a* on which each of the plurality of light emitting devices LED is seated, and a plurality of contact holes 917*b* exposing each of the plurality of connection electrodes CE. The plurality of opening holes 917*a* are parts into which a plurality of light emitting devices LEDs are inserted, and may also be referred to as pockets.

Referring to FIG. 9, the first clad layer 921*b* and the second clad layer 922*b* are arranged to extend to the outer area of the first conductive layer 921*a* and the second conductive layer 921*a*. In addition, the light emitting device LED can be arranged to overlap the first clad layer 921*b* and the second clad layer 922*b* extending to the outer area of the first conductive layer 921*a* and the second conductive layer 922*a*. That is, the light emitting device LED can be arranged so as not to overlap the first conductive layer 921*a* and the second conductive layer 922*a*.

Additionally, a portion of the second clad layer 922*b* of the plurality of second assembly wirings 922 can be exposed through the opening hole 917*a*. On the other hand, since the third passivation layer 116 covers all of the first assembly wiring 921 in the opening hole 917*a*, the first clad layer 921*b* of the first assembly wiring 921 overlaps the opening hole 917*a*, but may not be exposed at the opening hole 917*a*.

A plurality of reflectors PR can be disposed on the side of the first planarization layer 917 where the plurality of opening holes 917*a* are formed. A plurality of reflectors PR can be arranged to surround a plurality of light emitting devices LEDs. The plurality of reflectors PR are configured to converge light emitted from the plurality of light emitting devices LEDs. The plurality of reflectors PR can include, for example, aluminum (Al), but is not limited thereto.

The plurality of reflectors PR includes a first reflector RP1 disposed adjacent to the first assembly wiring 921 and a second reflector RP2 disposed adjacent to the second assembly wiring 922.

Referring to FIG. 9, the first reflector RP1 is arranged to contact the first clad layer 921*b* of the first assembly wiring 921 disposed below the third passivation layer 116 through a contact hole connection. So, the first conductive layer 921*a* and the first reflector RP1 can be electrically connected to the first clad layer 921*b*.

Additionally, the second reflector RP2 can be disposed on the second clad layer 922*b* of the second assembly wiring 922 and can be electrically connected to the second clad layer 922*b* and the second conductive layer 922*a*. That is, the first reflector RP1 can be electrically connected to the first assembly wiring 921, and the second reflector RP2 can be electrically connected to the second assembly wiring 922.

In the display device 900 according to the sixth embodiment, the first reflector RP1 is electrically connected to the first assembly wiring 921, and the second reflector RP2 is electrically connected to the second assembly wiring 922. Therefore, there is a technical effect of improving the assembly control of the light emitting device LED.

First, the light emitting device LED can be self-assembled in the opening hole 917*a* by the electric field formed by the first assembly wiring 921 and the second assembly wiring 922. In the display device 900 according to the sixth embodiment, a plurality of reflectors RP arranged to surround a light emitting device LED on top of the plurality of assembly wires 920 and a plurality of assembly wires 920 are connected to each other. Accordingly, the electric field formed by the plurality of assembly wirings 920 can be formed three-dimensionally stronger.

Accordingly, the attractive force to the light emitting device LED can be increased by the electric field formed by the plurality of assembly wirings 920 and the plurality of reflectors RP, and the light emitting device LED can be self-assembled and can be more stably stabilized in the opening hole 917*a*.

Accordingly, in the display device 900 according to the sixth embodiment, the first reflector RP1 is electrically connected to the first assembly wiring 921, and the second reflector RP2 is electrically connected to the second assembly wiring 922, so it is connected, the assembly control of the light emitting device LED can be improved, and there is a technical effect in that the light emitting device LED can be stably self-assembled.

FIG. 10 is a cross-sectional view of a display device according to a seventh embodiment. The display device 1000 of FIG. 10 differs from the display device 900 of FIG. 9 only in the first light absorption layer 1060, but other features are substantially the same, so duplicate descriptions will be omitted.

A connection electrode CE can be disposed in each of the plurality of sub-pixels SP. The plurality of connection electrodes CE can be disposed on top of the second plurality of transistors TR2 and electrically connected to the second plurality of transistors TR2.

Specifically, the connection electrode CE is electrically connected to the second capacitor electrode ST2 and the second source electrode SE2 of the second transistor TR2 through a contact hole formed in the second passivation layer 115. The connection electrode CE is an electrode for electrically connecting the light emitting device LED and the second transistor TR2 which is a driving transistor, and is made of the same material on the same layer as the first assembly wiring 921.

The transparent electrode TE can be disposed on the connection electrode CE. The transparent electrode TE can be disposed on the connection electrode CE to electrically connect the connection electrode CE and the light emitting device LED. The transparent electrode TE can be arranged to extend from the top of the connection electrode CE to the outside of the connection electrode CE. That is, a part of the transparent electrode TE may overlap the connection electrode CE, and another part of the transparent electrode TE can be extended to a position that does not overlap the connection electrode CE.

The transparent electrode TE can be formed of a transparent conductive material. The transparent electrode TE can be formed of, for example, ITO (Indium Tin Oxide), but is not limited thereto.

The first light absorption layer 1060 can be disposed on the plurality of second assembly lines 922. Specifically, the first light absorption layer 1060 can be disposed on the plurality of first assembly wiring lines 821, the plurality of second assembly wiring lines 922, and the connection electrode CE. The first light absorption layer 1060 is arranged to surround the area where the light emitting device LED is placed, and can flatten the area where the light emitting device LED is placed. Accordingly, the first light absorption layer 1060 can also function as a planarization layer.

The first light absorption layer 1060 can reduce color mixing between the plurality of sub-pixels SP and reduce external light reflection. The first light absorption layer 1060 can be made of a material having light absorption characteristics. For example, the first light absorption layer 1060 can be made of an opaque material, for example, black resin, but is not limited thereto.

Meanwhile, the first light absorption layer 1060 includes a plurality of opening areas 1060*a* in which each of the plurality of light emitting devices LEDs is seated, and a plurality of contact holes 160*b* exposing each of the plurality of connection electrodes CE. The plurality of opening areas 1060*a* are parts into which a plurality of light emitting devices LEDs are inserted, and may also be referred to as pockets.

Referring to FIG. 10, the first clad layer 921*b* and the second clad layer 922*b* can be arranged to extend to the outer area of the first conductive layer 921*a* and the second conductive layer 921*a*. And, the light emitting device LED is disposed to overlap the first clad layer 921*b* and the second clad layer 922*b* extending to the outer area of the first conductive layer 921*a* and the second conductive layer 921*a*. That is, the light emitting device LED can be arranged so as not to overlap the first conductive layer 921*a* and the second conductive layer 921*a*.

Additionally, a portion of the second clad layer 922*b* of the plurality of second assembly wirings 922 can be exposed through the opening hole 917*a*. On the other hand, since the third passivation layer 116 covers all of the first assembly wiring 921 in the opening hole 917*a*, the first clad layer 921*b* of the first assembly wiring 921 overlaps the opening 917*a*, but may not be exposed at the opening hole 917*a*.

A plurality of reflectors PR can be disposed on the side of the first light absorption layer 1060 where a plurality of opening holes 917*a* are formed. A plurality of reflectors PR can be arranged to surround a plurality of light emitting devices LEDs. The plurality of reflectors PR are configured to converge light emitted from the plurality of light emitting devices LEDs. The plurality of reflectors PR can include, for example, aluminum Al, but is not limited thereto.

The plurality of reflectors PR includes a first reflector RP1 disposed adjacent to the first assembly wiring 921 and a second reflector RP2 disposed adjacent to the second assembly wiring 922.

Referring to FIG. 10, the first reflector RP1 is arranged to contact the first clad layer 921*b* of the first assembly wiring 921 disposed below the third passivation layer 116 through a contact hole connection and can be electrically connected to the first clad layer 921*b*, the first conductive layer 921*a*, and the first reflector RP1. Additionally, the second reflector RP2 can be disposed on the second clad layer 922*b* of the second assembly wiring 922 and electrically connected to the second clad layer 922*b* and the second conductive layer 922*a*. That is, the first reflector RP1 can be electrically connected to the first assembly wiring 921, and the second reflector RP2 can be electrically connected to the second assembly wiring 922.

In the display device 1000 according to the seventh embodiment, the first reflector RP1 is electrically connected to the first assembly wiring 921, and the second reflector RP2 is electrically connected to the second assembly wiring 922. Therefore, there is a technical effect of improving the assembly control of the light emitting device LED.

First, the light emitting device LED can be self-assembled in the opening hole 1060*a* by the electric field formed by the first assembly wiring 921 and the second assembly wiring 921. At this time, since the first assembly wiring 921 and the second assembly wiring 921 are arranged on a plane, when an electric field is formed only with the first assembly wiring 921 and the second assembly wiring 922, the electric field can be configured to fix only the lower surface of the light emitting device LED.

On the other hand, in the display device 1000 according to the seventh embodiment, a plurality of reflectors RP and a plurality of assembly wires 920 are arranged to surround the light emitting device LED on the upper part of the plurality of assembly wires 920, respectively and are connected each other, so the electric field formed by the plurality of assembly wirings 920 can be formed in a three-dimensional direction.

Accordingly, the attractive force to the light emitting device LED can be increased by the electric field in the three-dimensional direction formed by the plurality of assembly wirings 920 and the plurality of reflectors RP, and the light emitting device LED can be more stably self-assemble at the opening hole 1060*a*.

Accordingly, in the display device 1000 according to the seventh embodiment, the first reflector RP1 is electrically connected to the first assembly wiring 921, and the second reflector RP2 is electrically connected to the second assembly wiring 922 and are to be is connected, so the assembly control of the light emitting device LED can be improved and there is a complex technical effect in that the light emitting device LED can be stably self-assembled.

In the display device 1000 according to the seventh embodiment, since the first light absorption layer 1060 is disposed between the plurality of assembly wirings 920 and the first planarization layer 118, and the first light absorption layer 1060 is arranged to surround the area where the light emitting device LED is placed, there is a technical effect of improving the brightness of the display device 1000.

First, in the existing display device, the light absorption layer is formed on the planarization layer and the pixel electrode, so that the light absorption layer is disposed on top of the plurality of light emitting devices.

Accordingly, the light emitted from the side of the plurality of light emitting devices and the light emitted diagonally upward are absorbed by the light absorbing layer, and a significant portion of the light emitted from the light emitting devices is absorbed by the light absorbing layer, so there might be a problem of decreased luminance of the display device, especially the side surface.

Accordingly, in the display device 1000 according to the seventh embodiment, the first light absorption layer 1060 is disposed between the plurality of assembly wirings 920 and the first planarization layer 1018, so the brightness, especially the side brightness, of the display device 1000 can be improved and the viewing angle can be improved by minimizing the absorbed light emitted from the light emitting device LED by the first light absorption layer 1060.

In particular, in the display device 1000 according to the seventh embodiment, the top surface of the first light absorption layer 1060 is located lower than the top surface of the plurality of light emitting devices LEDs, so that the luminance of the display device 1000, especially the side luminance, and the embodiment can be further improved and has the effect of further improving the viewing angle.

In addition, in the display device 1000 according to the seventh embodiment, the first light absorption layer 1060 is disposed on the plurality of assembly wirings 1020 and is arranged to surround the plurality of light emitting devices LEDs to function as a planarization layer.

Therefore, since a separate process for forming the first light absorption layer 1060 is not required, process costs can be reduced. Specifically, the first light absorption layer 1060 may function as a planarization layer and at the same time as a light absorption layer that reduces external light reflection phenomenon. Accordingly, since a separate first light absorption layer 160 may not be formed on the planarization layer, the number of processes can be reduced.

Accordingly, in the display device 1000 according to the seventh embodiment, the first light absorption layer 1060 is disposed on the plurality of assembly wirings 920 and is arranged to surround the plurality of light emitting devices LEDs and also serves as a planarization layer. So, the manufacturing process of the display device 1000 can be simplified and there is a technical effect of reducing process costs.

Additionally, in the display device 1000 according to the seventh embodiment, the transparent electrode TE is disposed on the connection electrode CE, and the pixel electrode PE is connected to the transparent electrode TE through the contact hole 118*b*. Thus, the external light reflection phenomenon in the contact hole 118*b* can be reduced.

Since the first light absorption layer 1060 is not disposed in the area where the contact hole 118*b* is formed, external light reflection may occur when a metal material is disposed in the contact hole 118*b*.

Accordingly, in the display device 1000 according to the seventh embodiment, a transparent electrode TE is disposed on the connection electrode CE, and an extended portion of the transparent electrode TE extending outside the connection electrode CE contacts is exposed by the hole 118*b* and connected to the pixel electrode PE.

Therefore, in the display device 1000 according to the seventh embodiment, there are complex technical effects in that the external light reflection shape in the contact hole 118*b* can be reduced regardless of the placement position of the first light absorption layer 1060, and the visibility of the display device 1000 can be improved.

Additionally, in the display device 1000 according to the seventh embodiment, light emitted from the light emitting device LED through the first light absorption layer 1060 is transmitted to the first active layer ACT1 and the second transistor TR1. It is possible to block incident light on the second active layer ACT2 of the transistor TR2 and the third active layer ACT3 of the third transistor TR3.

If the first active layer ACT1, the second active layer ACT2, and the third active layer ACT3 are made of an oxide semiconductor, the first active layer ACT1, the second active layer ACT2, and the third active layer ACT3 can be deteriorated by light incident on the first active layer ACT1, the second active layer ACT2, and the third active layer ACT3.

Accordingly, in the display device 1000 according to the seventh embodiment, the first light absorption layer 1060 is arranged to surround the area where the light emitting device LED is disposed, so there is a complex technical effect in that the light emitted from the light emitting device LED can be blocked on the active layer ACT1, the second active layer ACT2, and the third active layer ACT3 and seventh embodiment can improve the stability of the transistors TR1, TR2, and TR3.

FIG. 11 is a cross-sectional view of a display device according to an eighth embodiment. The display device 1100 of FIG. 11 differs from the display device 1000 of FIG. 10 only in that the third light absorption layer 1180 is further disposed, but other features are substantially the same, so duplicate descriptions will be omitted.

Referring to FIG. 11, a third light absorption layer 1180 can be further disposed on the lower planarization layer 114. The third light absorption layer 1180 can be disposed below the first assembly wiring 921 and the second assembly wiring 922 to overlap the opening hole 918*a*. That is, the third light absorption layer 1180 can be disposed in the lower area where the light emitting device LED is disposed.

The third light absorption layer 1180 may have light absorption characteristics to absorb light emitted from the light emitting device LED. The third light absorption layer 1180 can be made of an opaque material, for example, black resin, but is not limited thereto.

In the display device 1100 according to the eighth embodiment, the third light absorption layer 1180 is disposed on the lower planarization layer 114 overlapping the lower area where the light emitting device LED is disposed, and there is a technical effect that can minimize deterioration of the active layers ACT1, ACT2, ACT3 by light emitted from a light emitting device LED.

The third light absorption layer 1180 can block light emitted from the light emitting device LED to enter the active layers ACT1, ACT2, and ACT3 of the transistors TR1, TR2, and TR3 disposed below the lower planarization layer 114. When the active layers ACT1, ACT2, and ACT3 are made of an oxide semiconductor, the active layers ACT1, ACT2, and ACT3 can be deteriorated by light incident on the active layers ACT1, ACT2, and ACT3.

Accordingly, the third light absorption layer 1180 is disposed in the lower area where the light emitting device LED is disposed to prevent the light emitted from the light emitting device LED from entering the active layers ACT1, ACT2, and ACT3. Accordingly, in the display device 1100 according to the eighth embodiment, the third light absorption layer 1180 is disposed on the lower planarization layer 114 overlapping the lower area where the light emitting device LED is disposed, and there is a complex technical effect of minimizing deterioration of ACT2, ACT3 by light emitted from the light emitting device LED and improving the stability of transistors TR1, TR2, TR3.

FIG. 12 is a cross-sectional view of the display device according to the ninth embodiment. The display device 1200 of FIG. 12 is different from the display device 1100 of FIG. 11 only in that the second light absorption layer 1280 is further disposed, but other features are substantially the same, so duplicate descriptions will be omitted.

Referring to FIG. 12, the third light absorption layer 1280 can be disposed on the transistors TR1, TR2, and TR3. The third light absorption layer 1280 is disposed to surround the transistors TR1, TR2, and TR3 and can planarize the area where the transistors TR1, TR2, and TR3 are disposed.

Accordingly, the third light absorption layer 1280 may function as a lower planarization layer. At this time, the third light absorption layer 1280 is disposed at least throughout the display area AA to reduce external light reflection and at the same time to prevent light emitted from the light emitting device LED from entering the active layers ACT1, ACT2, and ACT3.

The third light absorption layer 1280 may have light absorption characteristics to absorb light emitted from the light emitting device LED and external light. The third light absorption layer 1280 can be made of an opaque material, for example, black resin, but is not limited thereto.

In the display device 1200 according to the ninth embodiment, the third light absorption layer 1280 is disposed to flatten the upper portions of the plurality of transistors TR1, TR2, and TR3 at least in the entire display area AA, and the active layers ACT1, ACT2, ACT3 can be minimized from being deteriorated by light emitted from the light emitting device LED. The third light absorption layer 1280 may block light emitted from the light emitting device LED from entering the active layers ACT1, ACT2, and ACT3 of the transistors TR1, TR2, and TR3.

If the active layers ACT1, ACT2, and ACT3 are made of an oxide semiconductor, the active layers ACT1, ACT2, and ACT3 can be deteriorated by light incident on the active layers ACT1, ACT2, and ACT3. Accordingly, the third light absorption layer 1280 is disposed in the lower area where the light emitting device LED is disposed, and can block light emitted from the light emitting device LED from entering the active layers ACT1, ACT2, and ACT3.

Accordingly, in the display device 1200 according to the ninth embodiment, the third light absorption layer 1280 is disposed to flatten the upper portions of the plurality of transistors TR1, TR2, and TR3 at least in the entire display area AA, and there is a complex technical effect of minimizing deterioration of the transistors ACT1, ACT2, and ACT3 by light emitted from the light emitting device and improving the stability of the transistors TR1, TR2, TR3.

Next, FIG. 13 is a cross-sectional view of the display device 1300 according to the tenth embodiment. The display device 1300 of FIG. 13 is different from the display device 1200 of FIG. 12 only in the first clad layer 1021*b*, the second clad layer 1022*b*, and the electrode hole 1023, and other features are substantially same, so duplicate descriptions will be omitted.

According to undisclosed internal technology, DEP Force is required for self-assembly, but due to the difficulty in uniformly controlling the DEP Force, problems arise where the light emitting device is tilted to a place other than the correct position within the assembly hall when assembling using self-assembly.

In addition, there is a problem in that the electrical contact characteristics are deteriorated in the electrical contact process due to tilting of the light emitting device, resulting in a decrease in the lighting rate.

Therefore, according to undisclosed internal technology, DEP Force is required for self-assembly, but when DEP Force is used, it faces a technical contradiction in that the electrical contact characteristics are deteriorated due to the tilting phenomenon of the semiconductor light emitting device.

For example, in the assembly electrode structure according to internal technology, a passivation layer which is an insulating film, is interposed between the first assembly electrode and the second assembly electrode, and self-assembly is in progress with only one of them exposed. However, since the assembly electrode structure is asymmetric, the electric field distribution is also asymmetrical, which can be biased to one side when assembling a semiconductor light emitting device. The bonding area between the assembly electrode exposed to the insulating film and the bonding metal of the light emitting device is small, so as the light emitting chip becomes smaller, there is something difficult in applying of signal.

Referring to FIG. 13, the first clad layer 1021*b* is disposed on the second passivation layer 115 and covers the first conductive layer 1021*a*, and a portion of the first clad layer 1021*b* is formed on the second conductive layer 1022*a* and may extend in the second clad layer 1022*b* direction.

In addition, the second clad layer 1022*b* is disposed on the third passivation layer 116, covers the second conductive layer 1022*a*, and a portion of the second clad layer 1022*b* is oriented toward the first conductive layer 1021*a* and can be extended to the first clad layer 8101*b*.

The first clad layer 1021*b* and the second clad layer 1022*b* are disposed with the third passivation layer 116 therebetween, and may overlap top and bottom.

Meanwhile, the second clad layer 1022*b* may have a predetermined electrode hole 1023 in an area overlapping with the light emitting device 130 and the first clad layer 1021*b*. The size of the electrode hole 1023 can be smaller than the size of the light emitting device 130.

Additionally, an alternating current voltage can be applied to the first clad layer 1021*b* and the second clad layer 1022*b* to generate an electric field. The DEP force caused by this electric field can be concentrated in the electrode hole 1023 provided in the second clad layer 1022*b*.

The light emitting device 130 can be self-assembled within the first opening hole 918*a* by a dielectrophoresis force (DEP force) generated by the electric field of the first clad layer 1021*a* and the second clad layer 1022*b*.

Meanwhile, the second clad layer 1022*b* can be disposed below the light emitting device 130. Additionally, the second clad layer 1022*b* can be in contact with the first electrode 134 of the light emitting device 130.

Therefore, as the second clad layer 1022*b* is disposed on the lower surface of the first electrode 134 of the light emitting device 130, the light emitting device 130 is supported uniformly.

Figure 14:
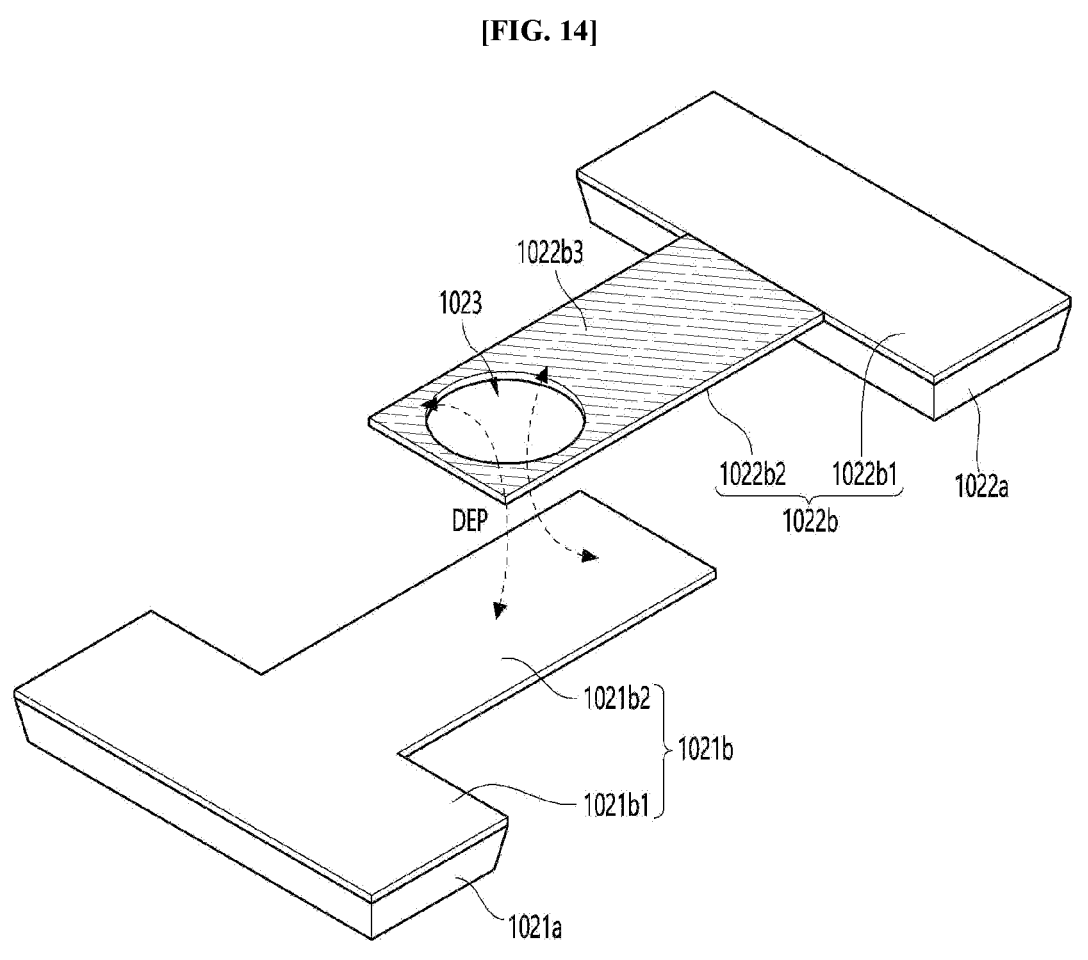

Next, FIG. 14 is a perspective view showing the assembly wiring of the display device according to the eleventh embodiment.

In the eleventh embodiment, a portion of the first clad layer 1021*b* and a portion of the second clad layer 1022*b* may overlap top and bottom. For example, the first clad layer 1021*b* can include a first-first clad layer 1021*b*1 and a first-second clad layer 1021*b*2.

The first-second clad layer 1021*b*2 can be a protruding electrode extending from the first-first clad layer 1021*b*1 toward the second clad layer 1022*b*.

Additionally, the second clad layer 1022*b* can include a second-first clad layer 1022*b*1 and a second-second clad layer 1022*b*2.

The second-second clad layer 1022*b*2 can be a protruding electrode extending from the second-first clad layer 1022*b*1 toward the first clad layer 1021*b*.

At this time, the first-second clad layer 1021*b*2 and the second-second clad layer 1022*b*2 may vertically overlap.

Additionally, the second-second clad layer 1022*b*2 can include an electrode hole 1023.

The electric field generated by the first clad layer 1021*b* and the second clad layer 1022*b* is concentrated on the electrode hole 1023 formed in the second clad layer 1022*b* to form a DEP force. The assembly force of the light emitting device 130 can be strengthened by concentrated DEP force.

According to the embodiment, the first clad layer 1021*b* of the first assembly electrode and the second clad layer 1022*b* of the second assembly electrode are arranged to overlap vertically, and the electrode hole 1023 of the second clad layer 1022*b* can be provided.

Accordingly, the DEP force can be concentrated and formed in the electrode hole 1023 of the second clad layer 1022*b*, and the Dep force is distributed uniformly at the assembly hole center, which has the technical effect of improving the assembly rate.

For example, according to the embodiment, the first clad layer 1021*b* of the first assembly electrode and the second clad layer 1022*b* of the second assembly electrode having the electrode hole 1023 are arranged to overlap vertically, so that there is a special technical effect of evenly concentrating strong DEP force at the center of the inside of the assembly hole.

In addition, according to the embodiment, since the effective electrode area of the mutually overlapping cladding layers is large, the capacitance of the assembly electrode is improved and the DEP force is large, so there is a technical effect in that a strong DEP force can be uniformly concentrated on the assembly hole center.

Meanwhile, a third reflector 1022*b*3 can be disposed on the second-second clad layer 1022*b*2. Accordingly, the third reflector 1022*b*3 can be disposed between the first electrode 134 of the light emitting device LED and the second clad layer 1022*b*.

In this case, light that might be lost from the light emitting device LED in the downward direction can be reflected to the outside of the display device by the third reflector 1022*b*3.

Therefore, in the eleventh embodiment, the light emitting device can be supported and electrically connected by the second clad layer 1022*b* and the third reflector 1023*b*. In addition, there is a complex technical effect that can strengthen the assembly force for the light emitting device through the vertical overlap structure of the wiring electrodes.

Next, FIG. 15 is a cross-sectional view of the display device 1400 according to the twelfth embodiment. The display device 1400 of FIG. 15 is different from the display device according to the embodiment of FIG. 3 only in the first assembly wiring 1121 and the second assembly wiring 1122, and other features are substantially the same, so duplicate description is omitted.

Referring to FIG. 15, the first assembly wiring 1121 can be disposed in the second passivation layer 115 and the second assembly wiring 1122 can be disposed in the third passivation layer 116. And a portion of the second assembly wiring 1122 can be in contact with the light emitting device 130.

Additionally, portions of the first assembly wiring 1121 and the second assembly wiring 1122 may overlap in the vertical direction and can be very close to each other in the horizontal direction.

At this time, the first assembly wiring 1121 and the second assembly wiring 1122 may not be located on the same plane. Additionally, the second assembly wiring 1122 may extend beyond the center HC of the assembly hole where the light emitting device 130 is assembled.

In this case, even if the light emitting device LED is tilted due to an imbalance in the electric field, the second assembly wiring 1122 can contact the lower surface of the light emitting device LED, there is a technical effect of securing electrical reliability by securing a sufficient contact area between the second assembly wiring 1122 and the light emitting device 130.

Additionally, the second assembly wiring 1122 may support the light emitting device 130. Additionally, since the first assembly wiring 1121 and the second assembly wiring 1122 do not overlap in the horizontal direction and do not contact each other, an electrical short circuit does not occur.

The display device including the semiconductor light emitting device according to the above-described embodiment has a technical effect in that the light absorption layer absorbs external light, prevents reflection of external light by metal electrodes, and improves visibility of the display device.

Additionally, the embodiment has the technical effect of improving the viewing angle and lateral brightness of the display device by changing the position of the light absorption layer.

In addition, the embodiment has the technical effect of simplifying the manufacturing process and reducing process costs because the light absorption layer also functions as a planarization layer and a separate process for forming the light absorption layer is not required.

In addition, the embodiment has the technical effect of blocking light emitted from the light emitting device toward the active layer containing an oxide semiconductor material, thereby minimizing deterioration of the active layer by light emitted from the light emitting device.

In addition, the embodiment has the technical effect of concentrating light emitted from the light emitting device and improving the brightness of the display device by arranging the reflector to surround the light emitting device.

Additionally, the embodiment has the technical effect of improving assembly control of the light emitting device by connecting the reflector arranged to surround the light emitting device to the assembly wiring.

In addition, the embodiment has the technical effect of strengthening the assembly force for the light emitting device by arranging the assembly wiring in a vertically symmetrical structure.

In addition, the embodiment supports the light emitting device evenly by arranging the first assembly wiring and the second assembly wiring to overlap between the top and bottom, and at the same time secures a wide electrical contact area between the assembly wiring and the electrode layer of the light emitting device, thereby improving carrier injection efficiency. There is a complex technical effect of improved luminous efficiency and improved brightness.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

EXPLANATION OF REFERENCES

10: Ledger substrate AA: Display area
NA: Non-display area SP: Sub pixel
SPR: Red sub-pixel SPG: Green sub-pixel
SPB: Blue sub-pixel
100, 500, 600, 700, 800, 900, 1000, 1100, 1200, 1300, 1400: Display device
110: substrate 111: buffer layer
112: gate insulating layer 113: first passivation layer
114: lower planarization layer 115: second passivation layer
118, 518, 817, 917, 1018: first planarization layer
**118*a*, 817*a*, 917*a*, 1018*a*: opening hole 118*b*, 518*b*, 817*b***: contact hole
119, 818, 918: second planarization layer **818*a*, 918*a***: opening hole
**818*b*: Contact hole 819**: Third planarization layer
PTL: protective layer 120: assembly wiring
121, 821, 921, 1021, 1121: first assembly wiring
**821*a*, 921*a*, 1021*a*, 1121*a***: first conductive layer
**121*b*, 921*b*, 1021*b*, 1121*b***: first clad layer
122, 822, 922, 1022, 1122: second assembly wiring
**122*a*, 822*a*, 922*a*, 1022*a*, 1122*a***: second conductive layer
**122*b*, 822*b*, 922*b*, 1022*b*, 1122*b***: second clad layer
**1021*b*1, 1022*b*1: first-first clad layer 1021*b*2, 1022*b*2**: first-second clad layer
**1022*b*3: Third reflector 1023**: Electrode hole
HC: Center LED in assembly hall: Light emitting device
130: red light emitting device 131: first semiconductor layer
132: light emitting layer 133: second semiconductor layer
134: first electrode 135: second electrode
140: green light emitting device 150: blue light emitting device
160, 1060: first light absorption layer 570, 670, 770, 870: second light absorption layer
1180, 1280: Third light absorption layer RP: Reflector
RP1: First reflector RP2: Second reflector
JL1: first jumping wire JL2: second jumping wire
LS: Light blocking layer SL: Scan wiring
DL: data wiring RL: reference wiring
VDD: High potential power wiring VDD1: first layer
VDD2: second layer VDD3: 3rd layer
TR1: first transistor ACT1: first active layer
GE1: first gate electrode SE1: first source electrode
DE1: first drain electrode TR2: second transistor
ACT2: second active layer GE2: second gate electrode
SE2: second source electrode DE2: second drain electrode
TR3: Third transistor ACT3: Third active layer
GE3: third gate electrode SE3: third source electrode
DE3: Third drain electrode ST: Storage capacitor
ST1: first capacitor electrode ST2: second capacitor electrode
CE: Connecting electrode TE: Transparent electrode
PE: pixel electrode CB: chamber
WT: Fluid MG: Magnetic
PD: Assembly pad PD1: First assembly pad
PD2: Second assembly pad PD3: Third assembly pad
PD4: Fourth assembly pad PD5: Fifth assembly pad
PD6: sixth assembly pad PL: Assembly wiring connection part
PL1: first connection PL2: second connection
PL3: Third connection PL4: Fourth connection
PL5: fifth connection PL6: sixth connection
LL: Link wiring SCL: Scribing line
IL: plural insulating layers

INDUSTRIAL APPLICABILITY

Embodiments can be adopted in the field of displays that display images or information.

Embodiments can be adopted in the field of displays that display images or information using semiconductor light emitting devices.

Embodiments can be adopted in the field of displays that display images or information using micro- or nano-level semiconductor light emitting devices.

The invention claimed is:

1. A display device comprising a semiconductor light emitting device, the display device comprising:

a substrate;

first assembly wiring and second assembly wiring alternately arranged on the substrate and spaced apart from each other;

a planarization layer disposed on the first assembly wiring and the second assembly wiring, having an opening hole and a contact hole;

a light emitting device disposed within the opening hole of the planarization layer, and having a first electrode overlapping the first assembly wiring and the second assembly wiring;

a first light absorption layer disposed to surround an area where the light emitting device is disposed and having light absorbing characteristics;

a transistor disposed below the first assembly wiring and the second assembly wiring;

a connection electrode disposed below the planarization layer and disposed on a top of the transistor and electrically connected to the transistor; and a pixel electrode electrically connecting the connection electrode and the light emitting device through the contact hole in the planarization layer.

2. The display device according to claim 1, wherein the first light absorption layer is disposed between the planarization layer and the first, second assembly wirings, and comprises an opening area overlapping the opening hole and the contact hole of the planarization layer.

3. The display device according to claim 2, wherein the planarization layer is disposed to surround a top surface and a side surface of the first light absorption layer.

4. The display device according to claim 3, wherein the planarization layer comprises:

a first planarization layer surrounding the top and side surfaces of the first light absorption layer; and a second planarization layer surrounding a top and side surfaces of the first planarization layer and covering a portion of a top surface of the light emitting device.

5. The display device according to claim 2, further comprising a transparent electrode disposed on the connection electrode to electrically connect the connection electrode and the pixel electrode, the transparent electrode being made of a transparent conductive material, wherein the first light absorption layer includes a contact area that overlaps the contact hole of the planarization layer, and wherein the contact hole of the planarization layer and the contact aera-area of the first light absorption layer expose the transparent electrode disposed on the connection electrode.

6. The display device according to claim 5, wherein the transparent electrode extends from a top of the connection electrode to an outside of the connection electrode, wherein the contact hole of the planarization layer and the contact area of the first light absorption layer are disposed on an extended portion of the transparent electrode.

7. The display device according to claim 2, further comprising at least one of a second light absorption layer disposed on the pixel electrode and a third light absorption layer disposed below the first assembly wiring and the second assembly wiring.

8. The display device according to claim 7, wherein the substrate includes a display area and a non-display area, wherein the third light absorption layer is disposed at least over the entire display area.

9. The display device according to claim 1, wherein the first light absorption layer is disposed on the planarization layer and has an opening area that overlaps an opening hole of the planarization layer.

10. The display device according to claim 9, further comprising a reflector disposed to surround the light emitting device, wherein the planarization layer comprises a first planarization layer disposed on the first assembly wiring and the second assembly wiring; and a second planarization layer disposed on the first planarization layer, and wherein the reflector is disposed on a side of the first planarization layer.

11. The display device according to claim 1, further comprising a third reflector between the second assembly wiring and the light emitting device.

12. The display device according to claim 1, wherein the second assembly wiring is arranged on a different plane from the first assembly wiring.

13. A display device comprising a semiconductor light emitting device, the display device comprising:

a substrate;

first assembly wiring and second assembly wiring alternately arranged on the substrate and spaced apart from each other;

a planarization layer disposed on the first assembly wiring and the second assembly wiring, and having an opening hole and a contact hole;

a light emitting device disposed within the opening hole of the planarization layer, and having a first electrode overlapping the first assembly wiring and the second assembly wiring; and a first light absorbing layer disposed to surround an area where the light emitting device is disposed and having light absorbing characteristics, wherein the first assembly wiring vertically overlaps the second assembly wiring, and wherein the second assembly wiring includes an electrode hole in a region that vertically overlaps the first assembly wiring.

14. A display device comprising a semiconductor light emitting device, the display device comprising:

assembly wiring arranged on a substrate;

a light emitting device disposed on the assembly wiring;

a planarization layer disposed on the assembly wiring and disposed to surround the light emitting device;

a light absorption layer disposed to surround the light emitting device and having light absorbing characteristics, wherein the light absorption layer is disposed between the assembly wiring and the planarization layer, and wherein the planarization layer comprises:

a first planarization layer disposed to surround side and top surfaces of the light absorption layer, and a second planarization layer disposed to surround side and top surfaces of the first planarization layer; and a first opening hole, which is an area formed by overlapping opening areas of each of the light absorption layer and the first planarization layer to overlap the assembly wiring, wherein the light emitting device is disposed in the first opening hole.

15. The display device according to claim 14, further comprising:

a transistor disposed below the assembly wiring;

a connection electrode disposed between the transistor and the planarization layer and electrically connected to the transistor;

a pixel electrode disposed on the connection electrode and the light emitting device, and electrically connected to the connection electrode and the light emitting device; and a second opening hole disposed to penetrate the light absorption layer and the first planarization layer, and electrically connecting the connection electrode and the pixel electrode.

16. The display device according to claim 14, further comprising a reflector disposed on a side of the light absorbing-absorption layer and reflecting light emitted from the light emitting device.

17. The display device according to claim 16, wherein the assembly wiring includes a conductive layer, and a clad layer disposed in contact with the conductive layer at a layer different from the conductive layer and extending to an area outside the conductive layer, and wherein the light emitting device is disposed to overlap an extended area of the clad layer.

18. The display device according to claim 17, wherein the assembly wiring comprises a first assembly wiring and a second assembly wiring disposed above the first assembly wiring, further comprising:

a first jumping wire disposed on a different layer from the second assembly wiring and electrically connected to the second assembly wiring; and a second jumping wire disposed below the light emitting device and electrically connected to the light emitting device, wherein the second assembly wiring is electrically connected to the light emitting device by the first jumping wiring and the second jumping wiring.

* * * * *